US010978371B2

(12) United States Patent
Kai et al.

(10) Patent No.: US 10,978,371 B2
(45) Date of Patent: Apr. 13, 2021

(54) SEMICONDUCTOR DEVICE AND METHOD FOR MANUFACTURING SEMICONDUCTOR DEVICE

(71) Applicant: FUJI ELECTRIC CO., LTD., Kawasaki (JP)

(72) Inventors: Kenshi Kai, Matsumoto (JP); Rikihiro Maruyama, Matsumoto (JP); Yoshihiro Miyazaki, Shiojiri (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 19 days.

(21) Appl. No.: 16/253,492

(22) Filed: Jan. 22, 2019

(65) Prior Publication Data

US 2019/0157183 A1 May 23, 2019

Related U.S. Application Data

(63) Continuation of application No. PCT/JP2017/044094, filed on Dec. 7, 2017.

(30) Foreign Application Priority Data

Feb. 13, 2017 (JP) .............................. JP2017-024091

(51) Int. Cl.
*H01L 23/40* (2006.01)
*H01L 23/373* (2006.01)
(Continued)

(52) U.S. Cl.
CPC ...... *H01L 23/4006* (2013.01); *H01L 21/4803* (2013.01); *H01L 21/4817* (2013.01);
(Continued)

(58) Field of Classification Search
CPC ......... H01L 2924/3511; H01L 23/3675; H01L 23/04; H01L 23/041; H01L 23/562;
(Continued)

(56) References Cited

U.S. PATENT DOCUMENTS 5,379,942 A * 1/1995 Kuhnert ............... B23K 20/002
228/106
5,508,560 A * 4/1996 Koehler .................. H01L 23/13
257/707
(Continued)

FOREIGN PATENT DOCUMENTS

JP 8-236667 A 9/1996
JP 9-45852 A 2/1997
(Continued)

OTHER PUBLICATIONS

Machine translation of JP 2012178525 (Year: 2012).*
International Search Report dated Mar. 6, 2018 in corresponding International Application No. PCT/JP2017/044094.

*Primary Examiner* — David A Zarneke

(57) ABSTRACT

A semiconductor device including an insulated circuit board on which a semiconductor chip is mounted, and a housing implemented by a plurality of side-walls including at least a first pair of facing side-walls, each of the facing side-walls having joint edges configured to be jointed with the insulated circuit board, and each of the joint edges has an arc-shape such that a center in an extending direction of the joint edge protrudes toward the insulated circuit board more than both ends of the extending direction of the joint edge.

20 Claims, 21 Drawing Sheets

(51) Int. Cl.
*H01L 23/00* (2006.01)
*H01L 21/48* (2006.01)
*H01L 25/18* (2006.01)
*H01L 25/07* (2006.01)
*H01L 23/36* (2006.01)
*H01L 23/12* (2006.01)
*H01L 23/04* (2006.01)
*H01L 21/52* (2006.01)
*H01L 23/13* (2006.01)
*H01L 23/10* (2006.01)

(52) U.S. Cl.
CPC .......... *H01L 21/4882* (2013.01); *H01L 21/52* (2013.01); *H01L 23/04* (2013.01); *H01L 23/041* (2013.01); *H01L 23/10* (2013.01); *H01L 23/12* (2013.01); *H01L 23/13* (2013.01); *H01L 23/36* (2013.01); *H01L 23/3735* (2013.01); *H01L 23/40* (2013.01); *H01L 23/562* (2013.01); *H01L 25/07* (2013.01); *H01L 25/18* (2013.01); *H01L 2023/405* (2013.01); *H01L 2023/4031* (2013.01); *H01L 2023/4087* (2013.01); *H01L 2924/16152* (2013.01); *H01L 2924/3511* (2013.01)

(58) Field of Classification Search
CPC .......... H01L 2924/16152; H01L 23/10; H01L 23/13; H01L 21/4803; H01L 21/4817; H01L 21/52
See application file for complete search history.

(56) References Cited

U.S. PATENT DOCUMENTS

| | | | | |
|---|---|---|---|---|
| 5,629,562 | A * | 5/1997 | Nomura | H01L 23/13 |
| | | | | 257/683 |
| 5,793,106 | A * | 8/1998 | Yasukawa | H01L 23/3121 |
| | | | | 257/706 |
| 5,981,036 | A | 11/1999 | Schulz-Harder et al. | |
| 6,787,900 | B2 * | 9/2004 | Shinohara | H01L 23/13 |
| | | | | 257/675 |
| 6,969,641 | B2 * | 11/2005 | Matsunami | H01L 21/565 |
| | | | | 257/E21.504 |
| 7,319,591 | B2 * | 1/2008 | Coffin | H01L 23/34 |
| | | | | 257/E23.08 |
| 7,728,231 | B2 * | 6/2010 | Matsui | F21V 19/0055 |
| | | | | 174/252 |
| 8,053,284 | B2 * | 11/2011 | Iruvanti | H01L 23/10 |
| | | | | 438/122 |
| 8,154,114 | B2 * | 4/2012 | Bayerer | H01L 24/37 |
| | | | | 257/700 |
| 8,288,208 | B1 * | 10/2012 | Liu | H01L 21/563 |
| | | | | 438/118 |
| 9,443,778 | B2 | 9/2016 | Otsubo et al. | |
| 9,666,504 | B2 * | 5/2017 | Abeyasekera | H01L 23/3735 |
| 9,711,430 | B2 | 7/2017 | Nishida et al. | |
| 9,887,154 | B2 * | 2/2018 | Takahashi | H01L 23/3735 |
| 10,306,800 | B2 * | 5/2019 | Wulf-Toke | H01L 23/10 |
| 10,534,413 | B2 * | 1/2020 | Shiraga | H05K 7/20472 |
| 10,541,219 | B2 * | 1/2020 | Uezato | H01L 24/09 |
| 2002/0050637 | A1 * | 5/2002 | Sekiya | H01L 21/76251 |
| | | | | 257/701 |
| 2013/0309621 | A1 * | 11/2013 | Huang | H01L 21/67288 |
| | | | | 432/18 |
| 2014/0374896 | A1 | 12/2014 | Nishida et al. | |
| 2015/0303126 | A1 | 10/2015 | Takahashi et al. | |
| 2016/0071778 | A1 | 3/2016 | Otsubo et al. | |

FOREIGN PATENT DOCUMENTS

| | | |
|---|---|---|
| JP | 2004-363521 A | 12/2004 |
| JP | 2005-294792 A | 10/2005 |
| JP | 2011-187711 A | 9/2011 |
| JP | 2012-178525 A | 9/2012 |
| JP | 2015-216349 A | 12/2015 |
| JP | 2016-58563 A | 4/2016 |
| WO | 2014/041936 A1 | 3/2014 |

* cited by examiner

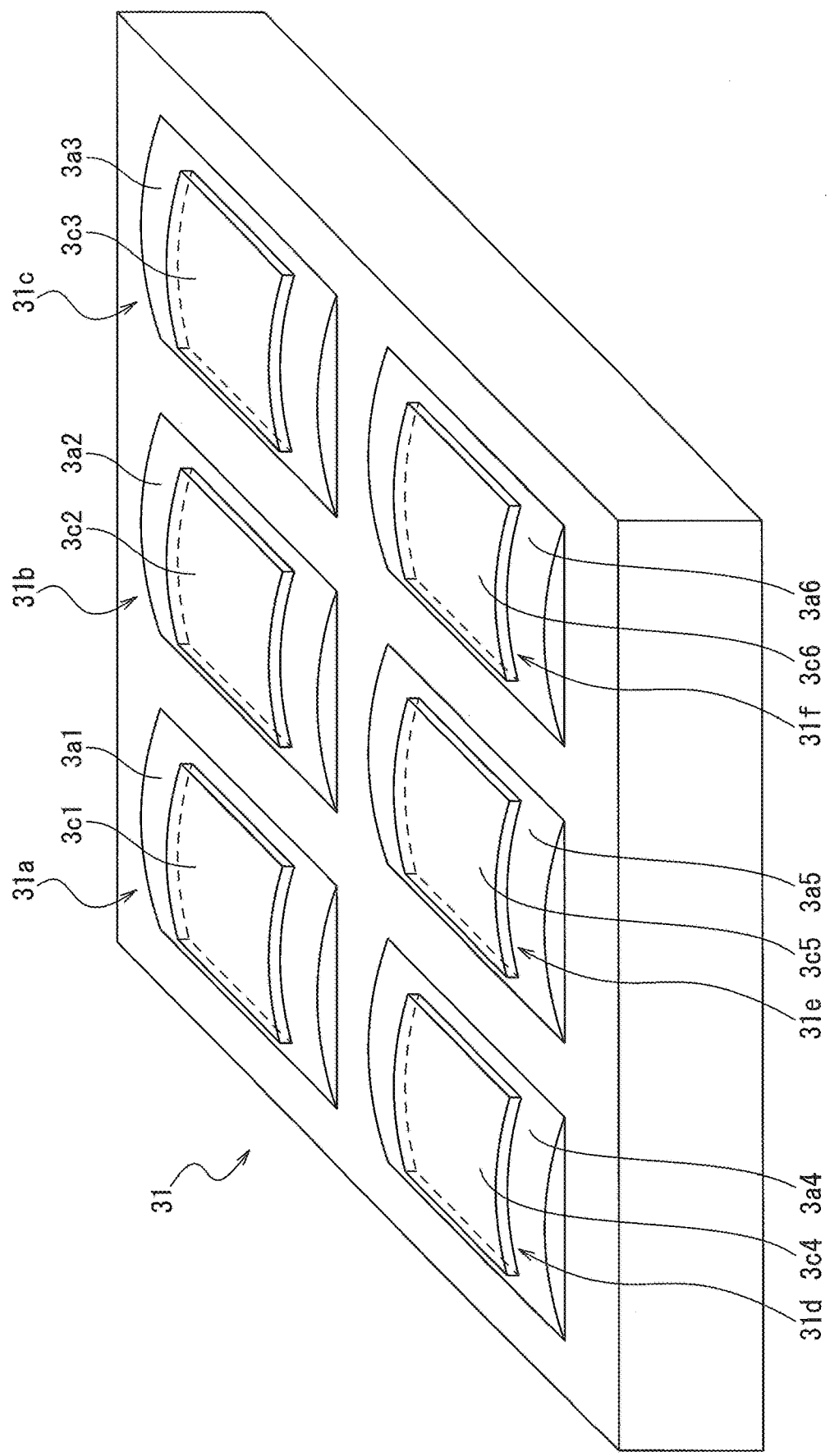

SEMICONDUCTOR DEVICE AND METHOD FOR MANUFACTURING SEMICONDUCTOR DEVICE

CROSS REFERENCE TO RELATED APPLICATIONS AND INCORPORATION BY REFERENCE

This application is a continuation of International Application No. PCT/JP2017/044094 filed on Dec. 7, 2017, and further claims benefit of priority under 35 USC 119 based on JP2017-024091 filed on Feb. 13, 2017, the entire contents of which are incorporated by reference herein.

BACKGROUND OF THE INVENTION

1. Field of the Invention

The present invention relates to a semiconductor device and a method for manufacturing the semiconductor device.

2. Description of the Related Art

For dissipating heat generated by operation of a semiconductor chip, a scheme of attaching a semiconductor device implemented by the semiconductor chip to a cooler, such as a heatsink or a cooling fin, particularly a semiconductor device used in power electronics or the like is attached to the cooler. Hereinafter, the semiconductor device used in power electronics is referred to as a "power semiconductor device". In the power semiconductor device, when a heating state during operation and a cooling state during non-operation are repeated, an insulated circuit board on which a semiconductor chip of the power semiconductor device is mounted may warp due to thermal expansion difference, and then, a shape of the semiconductor chip will change. Repetition of the heating state and the cooling state is referred to as a "heat cycle".

There are two cases in warpage of the insulated circuit board where the insulated circuit board is curved so as to protrude toward the cooler, the cooler is placed on an opposite side of the insulated circuit board to the semiconductor chip, and conversely the insulated circuit board is curved so as to protrude toward the semiconductor chip. Hereinafter, warpage where the insulated circuit board protrudes toward the cooler side is defined as a "positive warpage" and warpage where the insulated circuit board protrudes toward the semiconductor chip side is defined as a "negative warpage".

When the negative warpage occurs, for example, adhesion between bonding faces of the insulated circuit board and the cooler decreases to generate gaps, or voids, and alternatively, there is a case that the thermally conductive grease may flow out, or pump out, from between the bonding faces. As a result, thermal conductivity, or thermal conductance between the bonding faces decreases. If the adhesion between the bonding faces decreases or the grease pump-out further progresses, the heat-dissipation performance of the semiconductor device is remarkably deteriorated, and the semiconductor chip may be thermally damaged or the lifetime may be shortened.

In investigating a technique capable of preventing the negative warpage, for example, JP 2004-363521 A discloses a technique in which a semiconductor device is attached to a cooler via a metallic heat-dissipating plate on which an insulated circuit board is mounted, and a plurality of protrusions are provided on a surface of a housing of the semiconductor device facing the heat-dissipating plate. In the technique described in JP 2004-363521 A, with respect to the length and position of the protrusions of the housing which press the mounting surface of the heat-dissipating plate, each length of the protrusions is adjusted so that the protrusion closer to the center in the entire heat-dissipating plate are made longer. Then, the entire surface of the heat-dissipating plate is pressed by the protrusions having different lengths, and the heat-dissipating plate is deformed so that the central region is curved in the positive warpage.

In addition, JP 2012-178525 A discloses a package including a conducting base-plate, a semiconductor device disposed on the conducting base-plate, and a metallic wall, which is made of a material different from the conducting base-plate, involving the semiconductor device and disposed on the conducting base-plate. The conducting base-plate has a pair of opposing edges having a gradual arc, and the metal wall also has a gradual arc. In the technique described in JP 2012-178525 A, a warpage in a shorter side-wall direction of the conducting base-plate is formed using a press mold so as to give a strength in a long-side direction of the conducting base-plate, and warpages which occur during bonding, implementing, and cap-soldering of the semiconductor substrate, is prevented.

However, since JP 2004-363521 A is a technique of deforming the metallic heat-dissipating plate, the technique disclosed in JP 2004-363521 A can not be applied to a semiconductor device having a "base-less structure", which is a structure without a heat-dissipating plate, in the base-less structure an insulated circuit board is directly attached to a cooler, for example. Specifically, the insulated circuit board includes an insulating substrate mainly made of ceramics or the like. Therefore, technical considerations as to the strength of the insulated circuit board in the base-less structure, and to an issue of the attachment between the insulated circuit board curved in the positive warpage and the cooler is necessary, when the insulated circuit board is curved in the positive warpage by using the technique of JP 2004-363521 A which is based on the deformation of the metallic heat-dissipation plate. However, in JP 2004-363521 A, the technical considerations have not been made sufficiently.

Also in the case of the technique described in JP 2012-178525 A, the technical examination on deformation of the insulated circuit board is not sufficiently done. For example, in JP 2012-178525 A, although the conducting base-plate is bended by a press mold, since the strength of the insulating substrate including ceramics and the like is completely different from a strength of a metallic base plate, and the strength of the insulating substrate is lower than the metallic base plate, if the press mold is directly applied to the insulated circuit board, the insulated circuit board may be damaged by the force applied during pressing. Further, since the semiconductor chip mounted on the insulated circuit board is a sophisticated and delicate electronic device, when the insulated circuit board is deformed by the press-die, the semiconductor chip may be damaged. Therefore, in manufacturing a semiconductor device having a base-less structure, it is practically difficult to apply a press mold.

SUMMARY OF THE INVENTION

In order to achieve the above-mentioned object, an aspect of the present invention inheres in a semiconductor device including (a) an insulated circuit board on which a semiconductor chip is mounted; and (b) a housing implemented by a plurality of side-walls including at least a first pair of facing side-walls, each of the facing side-walls having joint edges configured to be jointed with the insulated circuit board, and each of the joint edges has an arc-shape such that a center in an extending direction of the joint edge protrudes toward the insulated circuit board more than both ends of the extending direction of the joint edge.

Another aspect of the present invention inheres in a method for manufacturing a semiconductor device including (a) mounting a semiconductor chip on an insulated circuit board; (b) preparing a housing implemented by a plurality of side-walls including at least a first pair of facing side-walls, each of the facing side-walls having joint edges configured to be jointed with the insulated circuit board, and each of the joint edges has an arc-shape such that a center in an extending direction of the joint edge protrudes toward the insulated circuit board more than both ends of the extending direction of the joint edge; and (c) jointing the insulated circuit board to the housing.

BRIEF DESCRIPTION OF THE DRAWINGS

FIG. 22 is a schematic perspective view as seen from a back side, illustrating a configuration of a semiconductor device according to a third embodiment.

DETAILED DESCRIPTION OF THE PREFERRED EMBODIMENTS

Figure 1:
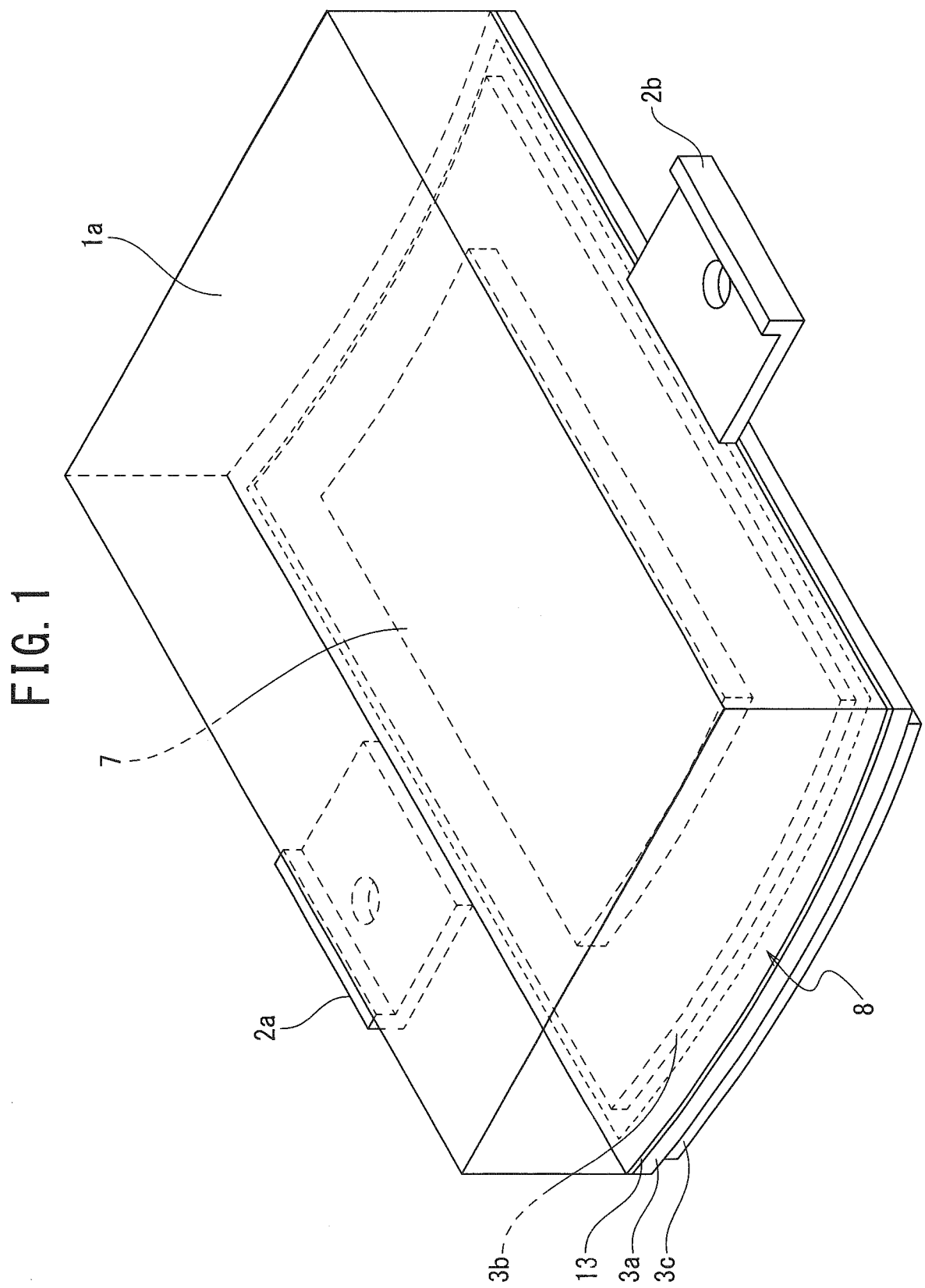
FIG. 1 is a schematic perspective view, or schematic bird's-eye view, illustrating a configuration of a semiconductor device according to a first embodiment.

First to third embodiments of the present invention will be described below. In the following description of the drawings, the same or similar parts are denoted by the same or similar reference numerals. However, it should be noted that the drawings are schematic, the relationship between the thickness and the planar dimension, the ratio of the thickness of each device and each member, etc. may be different from the actual one. Therefore, specific thicknesses and dimensions should be determined with reference to the following description. In addition, it should also be understood that the respective drawings are illustrated with the dimensional relationships and proportions different from each other.

Further, in the following descriptions, the terms relating to directions, such as "left and right" and "top and bottom" are merely defined for illustration purposes, and thus, such definitions do not limit the technical spirit of the present invention. Therefore, for example, when the paper plane is rotated by 90 degrees, the "left and right" and the "top and bottom" are read in exchange. When the paper plane is rotated by 180 degrees, the "left" is changed to the "right", and the "right" is changed to the "left".

(First Embodiment)

—Structure of Semiconductor Device—

Figure 4:
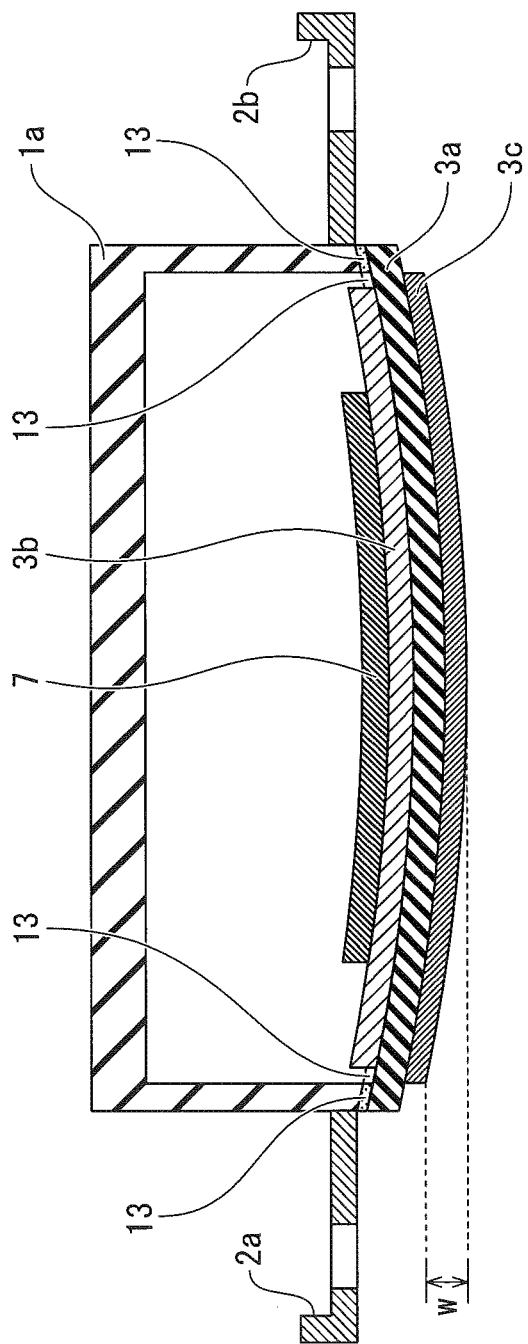
FIG. 4 is a cross-sectional view taken along the line IV-IV in FIG. 2.

As illustrated in FIGS. 1 and 4, a semiconductor device according to a first embodiment includes an insulated circuit board ($3a$, $3b$, $3c$) having a rectangular-shape on which a semiconductor chip 7 is mounted, and a box shaped housing $1a$ having a rectangular-parallelepiped topology. The lower edges of four side-walls of the housing $1a$ are served as joint edges 8 jointed to the periphery of the insulated circuit board ($3a$, $3b$, $3c$). The housing $1a$ is jointed to the insulated circuit board ($3a$, $3b$, $3c$) via a layer of an adhesive 13. The housing 1*a* has a first attachment plate 2*a* and a second attachment plate 2*b* for attaching to a cooler.

In the semiconductor device according to the first embodiment, among four lower edges of the side-walls, which provide the joint edges 8 of the housing 1*a*, the lower edges of a pair of shorter side-walls in the four side-walls, or the two sides of side-walls facing each other, which are positioned on the right rear side and the left front side of the housing 1*a* illustrated in FIG. 1, have smooth arc-shape to be convex downward, respectively. In other words, each of the two joint edges 8 at the lower edges of the two shorter side-walls of the housing 1*a* has an arc-shape such that, when viewed from each of the fronts of the main-surfaces of the two side-walls, each of the centers in extending directions of the shorter side-walls is curved and protrudes toward the insulated circuit board (3*a*, 3*b*, 3*c*) more than the both ends of the extending directions, so as to be convex downward. As can be seen from the region schematically illustrated by hatching in FIG. 2, the joint edges 8 of the housing 1*a* are allocated along the four sides of the rectangular insulating substrate 3*a* of the insulated circuit board (3*a*, 3*b*, 3*c*).

The semiconductor device according to the first embodiment is implemented by a semiconductor module which includes the semiconductor chip 7, the insulated circuit board (3*a*, 3*b*, 3*c*) and the housing 1*a*. A cooler is attached to the semiconductor module. The cooler is placed on a cooler-side main-surface of the insulated circuit board (3*a*, 3*b*, 3*c*), the cooler-side main-surface is assigned at opposite side of the chip-side main-surface, to which the semiconductor chip 7 is mounted. Illustration of the cooler is omitted in FIGS. 1 and 2.

The housing 1*a* may be made of an insulating material, such as a resin, for example, and, as illustrated in FIG. 1, the housing 1*a* may be realized in a box-shape having a substantially rectangular-parallelepiped topology, in which a window is provided on a part of the bottom of the parallelepiped. In the semiconductor module, the semiconductor chip 7 is placed inside of the housing 1*a* through the window at the bottom of the housing 1*a*. The semiconductor chip 7, a chip-side conductive-foil 3*b* and the chip-side main-surface of the insulating substrate 3*a* are housed inside the housing 1*a*. The insulating substrate 3*a* is disposed so as to occlude the window in the bottom surface of the housing 1*a*.

Figure 3:
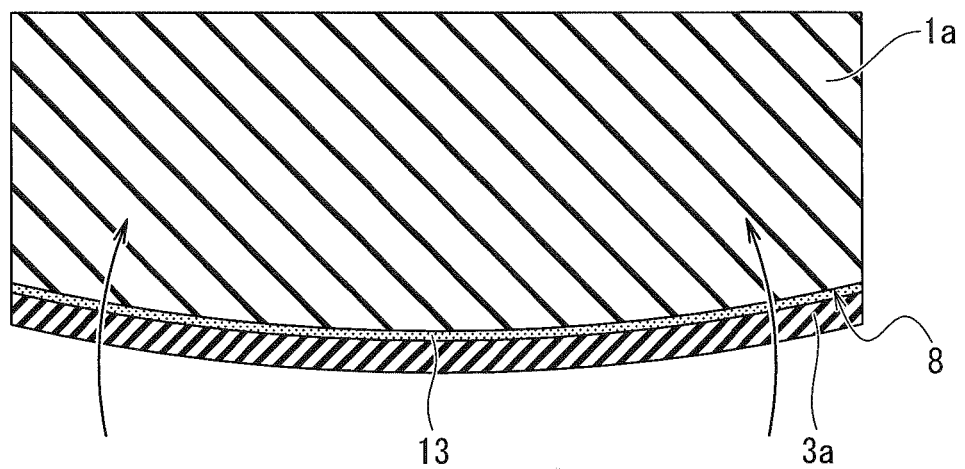
FIG. 3 is a cross-sectional view as seen from the direction of the line in FIG. 2.

As illustrated in FIG. 3, when the insulated circuit board (3*a*, 3*b*, 3*c*) are jointed to the housing 1*a*, the shape of the insulated circuit board (3*a*, 3*b*, 3*c*) is forced to curve in the positive warpage toward the cooler side, by the lower edge of the shorter side-walls of the housing 1*a*. As illustrated in FIG. 3, when the main-surface of the side-wall is viewed from the front, the joint edge 8, which is allocated to the lower edge of the shorter side-wall of the housing 1*a*, appears in an arc shape.

An upper limit of a warpage amount may be set in view of cracking prevention of the insulated circuit board (3*a*, 3*b*, 3*c*). In the housing 1*a* of the semiconductor device illustrated in FIG. 4, the warpage amount w is set to be greater than zero micrometer and about 100 micrometers or less. That is, zero micrometer<w≤100 micrometers. The "positive-warpage amount w" is a distance between the highest position in the bottom surface of the cooler-side conductive-foil 3*c* at the left or right ends in FIG. 4, and the most downward protruding position to the cooler side at the center of the cooler-side conductive-foil 3*c*.

For the insulated circuit board (3*a*, 3*b*, 3*c*), for example, a copper-bonded substrate, such as direct-copper-bonding (DCB) substrate and the like, in which a copper plate or the like are bonded to a chip-side main-surface of the ceramics-base insulating substrate 3*a* as the chip-side conductive-foil 3*b*, and furthermore, the copper plates or the like are bonded to a cooler-side main-surface of the insulating substrate 3*a* as the cooler-side conductive-foil 3*c* may be adopted. In FIG. 1, the chip-side main-surface is assigned to a main-surface of the circuit pattern side, and the cooler-side main-surface is assigned to an opposite main-surface, which is to be connected with the cooler. As representative examples of the copper bonded substrate, a DCB substrate and an active-metal-brazing (AMB) substrate are known.

For the insulating substrate 3*a*, for example, alumina ($Al_2O_3$) ceramics, aluminum nitride (AlN) ceramics, silicon nitride ($Si_3N_4$) ceramics, or the like may be used. In the insulating substrate 3*a*, a certain warpage is originally generated in the production process of the insulating substrate 3*a*. By adjusting contents of ceramics in the insulating substrate 3*a* and a thickness of the insulating substrate 3*a*, the warpage amount generated in the insulating substrate 3*a* in the manufacturing process of the semiconductor device according to the first embodiment may be controlled in advance.

An area and a thickness of the cooler-side conductive-foil 3*c* are set so that a volume of the cooler side conductive-foil 3*c* is larger than a volume of the chip-side conductive-foil 3*b*. Since the volume of the cooler-side conductive-foil 3*c* located at the cooler-side main-surface of the insulating substrate 3*a* is larger than the volume of the chip-side conductive-foil 3*b* located at chip-side main-surface of the insulating substrate 3*a*, an extension amount by heating in a heat cycle is larger in the cooler-side conductive-foil 3*c* than in the chip-side conductive-foil 3*b*. In order to make the volume of the cooler-side conductive-foil 3*c* larger than the volume of the chip-side conductive-foil 3*b*, for example, a specific method in which, by making surface areas substantially the same, the thickness of the cooler-side conductive-foil 3*c* is made thicker than the chip-side conductive-foil 3*b*, may be adopted.

For the semiconductor chip 7, for example, a semiconductor element, such as an insulated gate bipolar transistor (IGBT) or the like, may be adopted. The semiconductor chip 7 is electrically connected to the chip-side conductive-foil 3*b* by soldering, for example. Illustration of the stacked structure or arrangement of the semiconductor regions inside the semiconductor chip 7 is omitted.

For the adhesive 13, a thermoplastic resin which softens and solidifies according to temperature, or a thermocompression-type resin which contains, as a main component, a thermosetting resin solidified by chemical reaction when heated, is preferable. The stronger the adhesion force which corresponds to the hardness after hardening of the adhesive 13, the greater the force with which the insulated circuit board (3*a*, 3*b*, 3*c*) follows from the arc-shape of the lower edge of the side-wall of the housing 1*a*. In the semiconductor device according to the first embodiment, the following force of the lower edge of the side-wall of the housing 1*a* to the arc-shape is controlled by adjusting the adhesive force of the adhesive 13.

More specifically, in the semiconductor device according to the first embodiment, the shape of the lower edge of the side-wall, which serves as the joint edge 8, in the housing 1*a*, the original warpage of the insulated circuit board (3*a*, 3*b*, 3*c*) generated in the manufacturing process, and the adhesive force of the adhesive 13 are respectively adjusted and combined. By such combination, the positive-warpage amount w of the insulated circuit board (3*a*, 3*b*, 3*c*) incorporated in the semiconductor module may be controlled.

Figure 5:
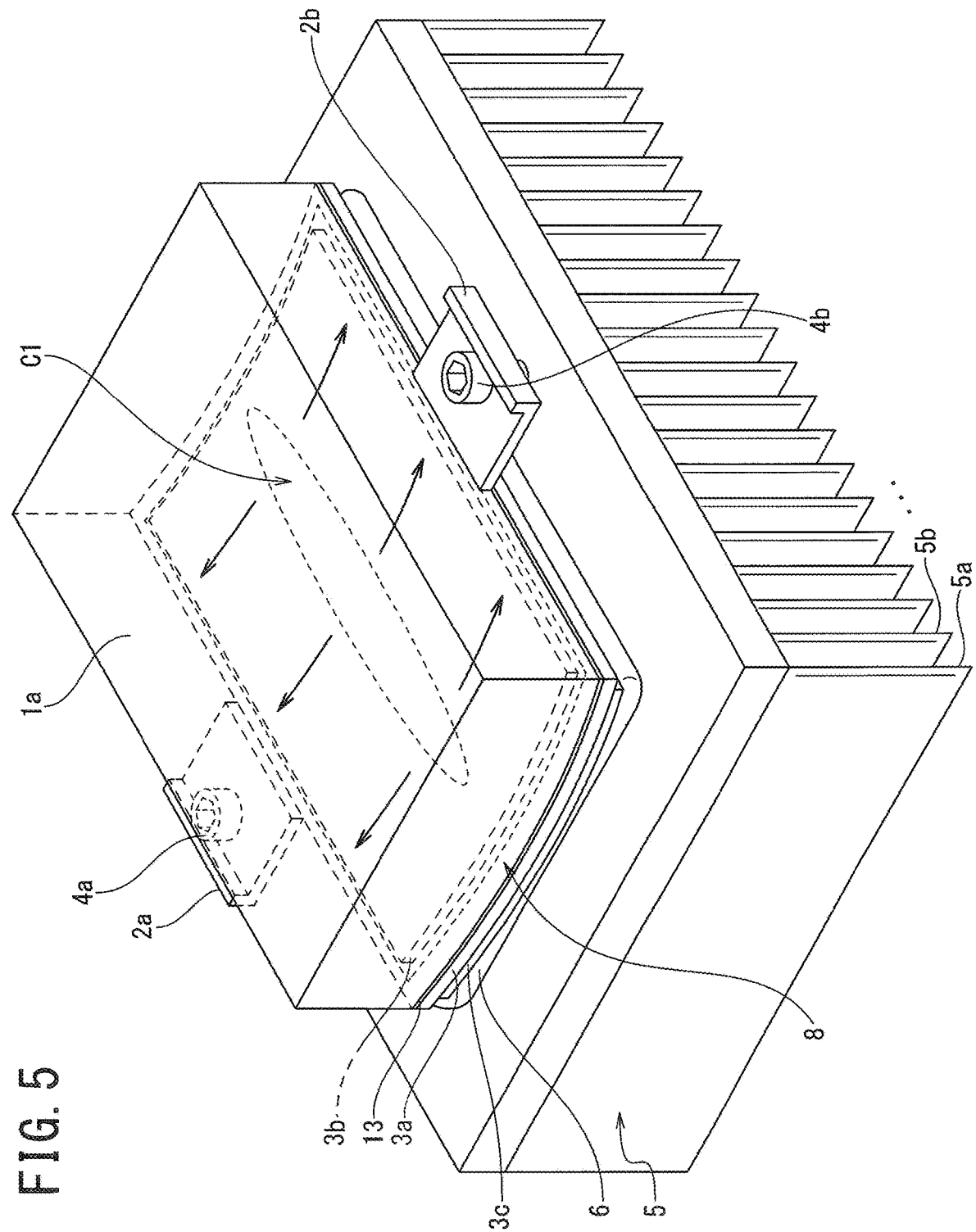
FIG. 5 is a schematic perspective view illustrating a state in which a thermal grease is pressed and spread out from a center to an outer side when the semiconductor device according to the first embodiment is attached to a cooler.

As illustrated in FIG. 5, the semiconductor module is attached to a cooler 5 using, for example, a first attachment screw 4a and a second attachment screw 4b, which are made of metal. The first attachment screw 4a is inserted into a threaded hole provided in the cooler 5 via a first attachment plate 2a of the housing 1a, and a second attachment screw 4b is inserted into a threaded hole provided in the cooler 5 via a second attachment plate 2b of the housing 1a.

A "first attachment portion" is implemented by the first attachment screw 4a and the first attachment plate 2a positioned on the left rear side in FIG. 5, and a "second attachment portion" is implemented by the second attachment screw 4b and the second attachment plate 2b positioned on the right hand front side in FIG. 5. Since the first attachment plate 2a and the second attachment plate 2b are made of metal, for example, and have a certain elasticity, when attaching the semiconductor module to the cooler 5, stress applied to the insulating substrate 3a may be reduced and cracking of the ceramic may be prevented, due to the spring effect.

As the cooler 5, as illustrated in FIG. 5, it is possible to use a cooling fin which expands an entire heat-transfer area so as to increase heat-exchange efficiency by providing a plurality of heat-radiation plates 5a, 5b, . . . , on a lower edge of the cooler 5. In addition, a heat sink or the like, serving for heat radiation and heat absorption, may be used for the cooler 5.

A large amount of heat is generated during power-supply operation of the semiconductor chip 7 and the heat generated in the semiconductor chip 7 is transmitted to the cooler 5 and released to the outside so that the temperature of the semiconductor module does not rise too much due to the generated heat. As illustrated in FIG. 5, the heat-radiation plates 5a, 5b, . . . are arranged in parallel with equal intervals and extend in a direction orthogonal to the long-side of the housing 1a, from the left rear side to the right front side in FIG. 5. In FIG. 5, illustration of the semiconductor chip 7 is omitted for convenience of explanation.

Between the semiconductor module and the cooler 5, a thermal grease 6 may be used to enhance heat dissipation. The thermal grease 6 is applied so as to have a rectangular shape in a planar pattern. As illustrated in FIG. 5, in the insulated circuit board (3a, 3b, 3c), a proximity area C1, which extends in a bar-shape along the longer side-walls, is defined between the lower edges of the facing shorter side-walls. Namely, the bar-shape spans between the approximate centers of the lower edges of the facing shorter side-walls. The proximity area C1 exemplifies an area proximate to the cooler 5.

Figure 2:
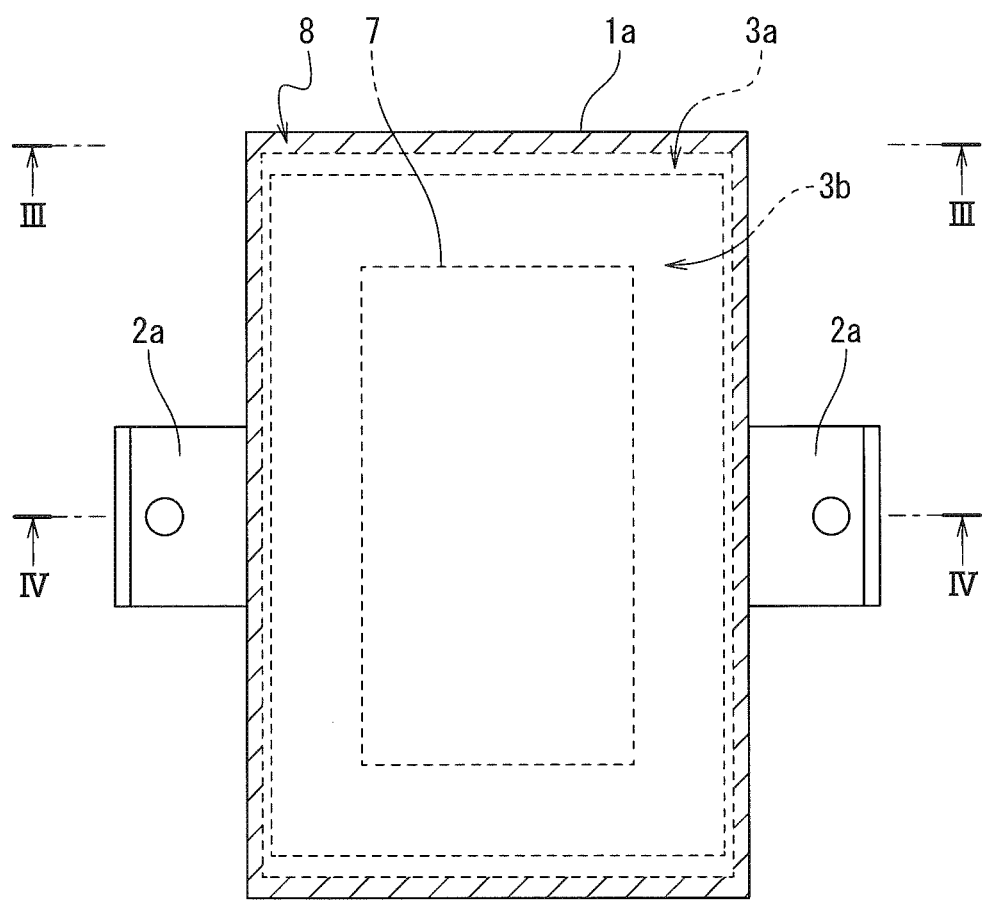
FIG. 2 is a schematic plan view illustrating a configuration of a semiconductor device according to a first embodiment.
Figure 6:
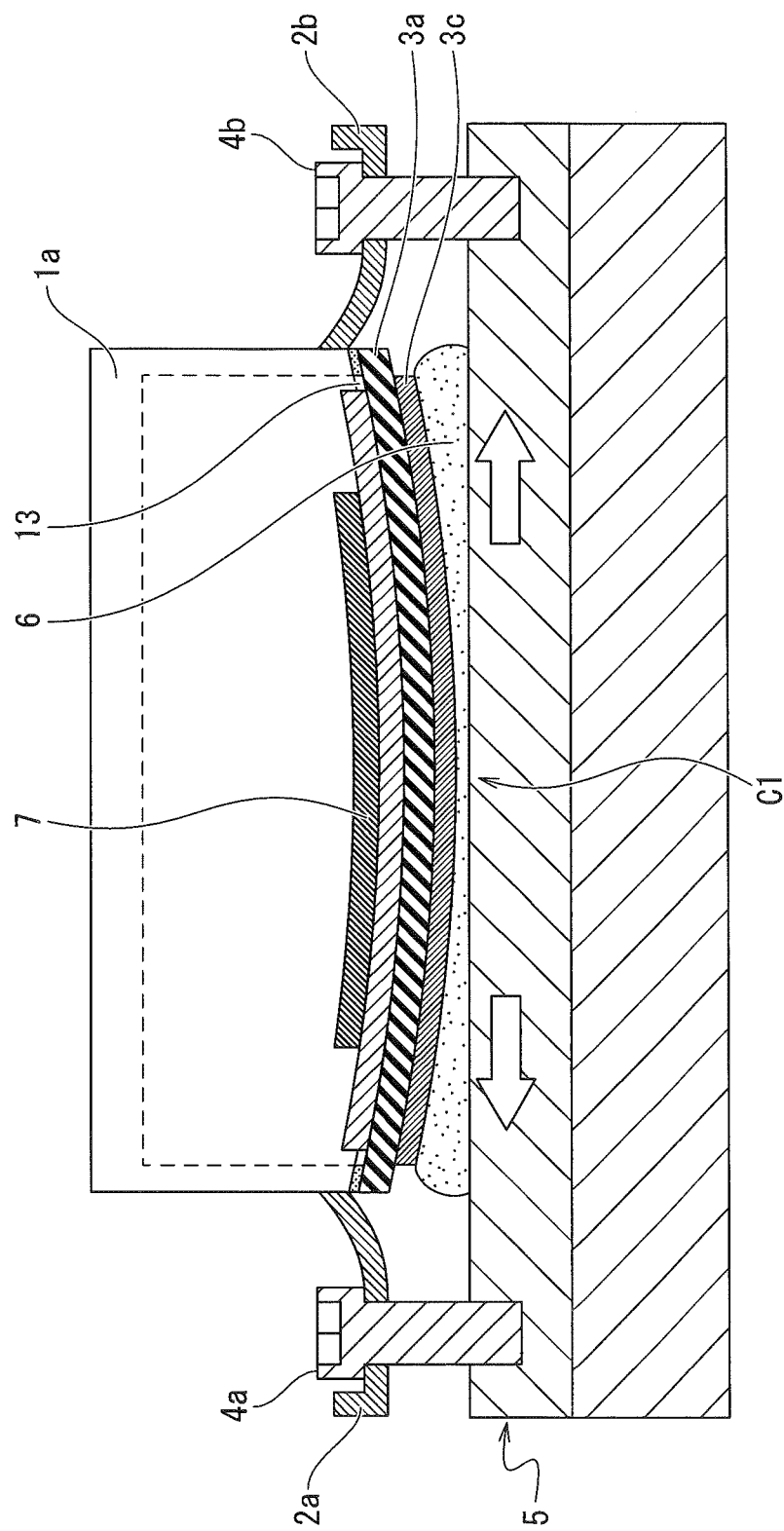
FIG. 6 is a cross-sectional view illustrating an internal structure of the semiconductor device according to the first embodiment when the semiconductor device is attached to the cooler.

FIG. 6 is a cross-sectional view of the semiconductor module attached to the cooler 5 taken on the line IV-IV in FIG. 2. As illustrated in FIG. 6, the thermal grease 6 is pushed out from the proximity area C1 at the center toward the two longer side-walls at the left and right of the housing 1a. In the inside of the housing 1a in FIG. 5, the pushing-out directions of the thermal grease 6 are schematically illustrated with six solid arrows.

As illustrated in FIG. 6, in a layer of the thermal grease 6, thickness at a limited region of the insulated circuit board (3a, 3b, 3c) in contact with the proximity area C1 is the thinnest compared to the other regions, and thus, the region in contact with the proximity area C1 has the highest thermal conductance.

As illustrated in FIG. 6, in the semiconductor device according to the first embodiment, between the cooler-side conductive-foil 3c of the insulated circuit board (3a, 3b, 3c) and the cooler 5, a metallic heat-dissipation base is not used.

Figure 7:
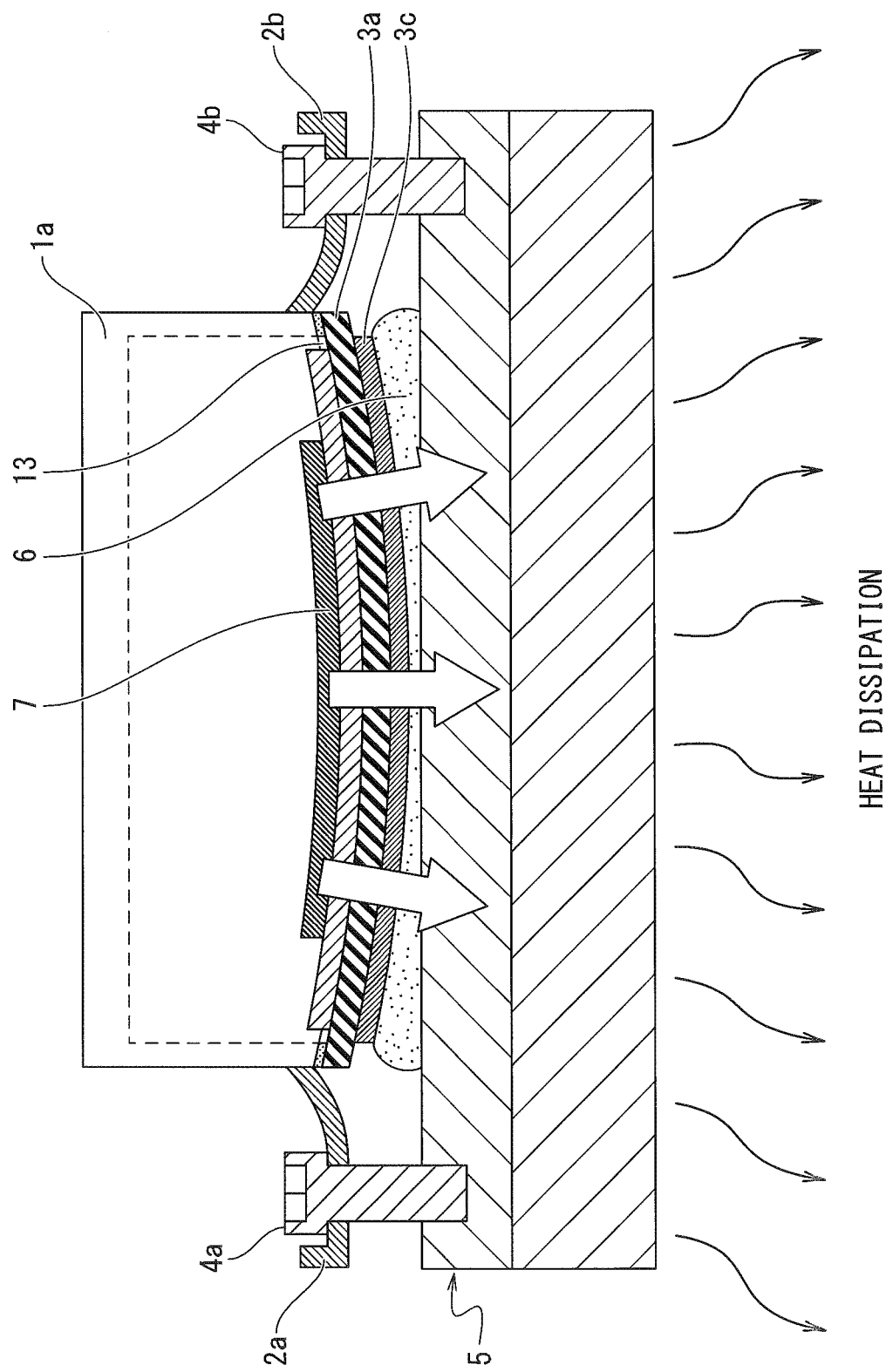
FIG. 7 is a cross-sectional view illustrating a heat dissipation from the semiconductor device according to the first embodiment to the cooler when the semiconductor device is attached to the cooler.

In order to achieve cost-cutting and reduction of thermal resistance, the semiconductor device according to the first embodiment has a so-called baseless structure in which the semiconductor module is directly fixed to the cooler 5 via only the thermal grease 6 without using a heat-dissipation base. In the semiconductor device according to the first embodiment, because the insulated circuit board (3a, 3b, 3c) has a rectangular-shape, and the insulated circuit board (3a, 3b, 3c) is in contact with the housing 1a at the joint edges 8, which are assigned to the lower edges of the four side-walls of the housing 1a, the insulated circuit board (3a, 3b, 3c) follows the arc-shapes of the lower edges of the shorter side-walls of the housing 1a at a frame-like periphery of the insulated circuit board (3a, 3b, 3c), and is forced to curve in a convex-shape toward the cooler 5. Thus, by using the insulated circuit board (3a, 3b, 3c) which is forced to curve downward, as illustrated in FIG. 7, even when a heat cycle is applied, change in shape of the insulated circuit board (3a, 3b, 3c) may be prevented, and heat can be reliably dissipated over a long period of time.

—Comparative Example—

Figure 8:
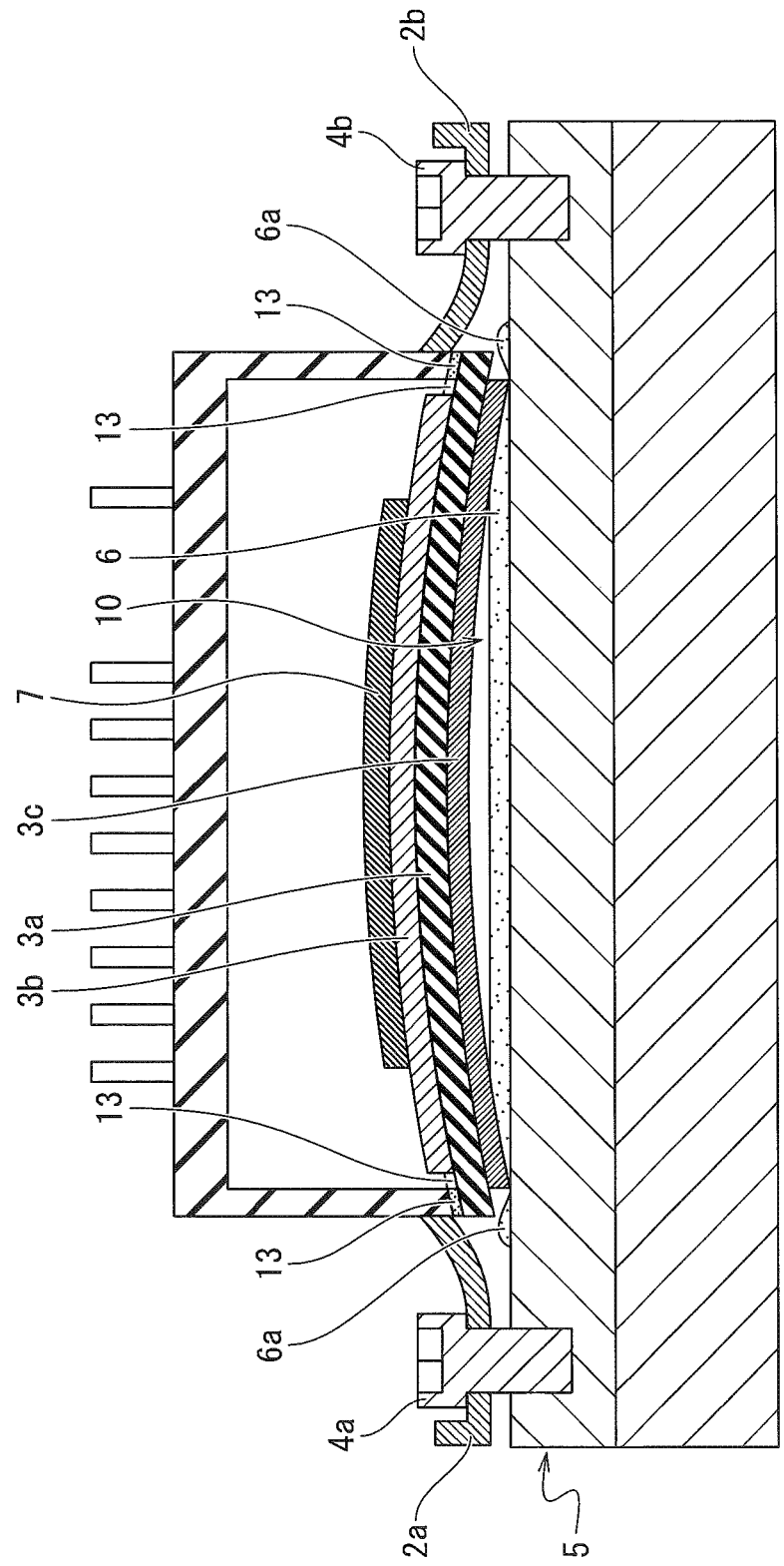
FIG. 8 is a cross-sectional view illustrating a spreading state of the thermal grease between the semiconductor device and the cooler when the semiconductor device having an insulated circuit board curved in a negative warpage, is attached to the cooler.

As illustrated in FIG. 8, in a semiconductor device according to a comparative example, even before applying the above heat cycle explained in the first embodiment, the insulated circuit board (3a, 3b, 3c) may be curve upward in a convex-shape due to a thermal history applied during a process of soldering for mounting the semiconductor chip 7 on the insulated circuit board (3a, 3b, 3c). Since the size and shape of the semiconductor chip 7 are different according to specifications desired by customers, the amount of heat quantity applied during the process such as soldering is also different. Therefore, the curving direction and warpage amount generated in the insulated circuit board (3a, 3b, 3c) are varied depending on the mounted semiconductor chip 7.

More specifically, it is usually very difficult to apply a single condition for controlling the warpage amount of various insulated circuit board (3a, 3b, 3c), each of which depend on wide variety of behaviors and performances, by adjusting the heat quantity which is to be applied when mounting the various kinds of semiconductor chips 7. When the insulated circuit board (3a, 3b, 3c) is curved in a negative-warpage as in the case of the comparative example illustrated in FIG. 8, the thermal grease 6 may not sufficiently spread out when attaching to the cooler 5, and then, a gap 10 may be formed so as to deteriorate the close adhesion performance between the insulated circuit board (3a, 3b, 3c) and the cooler 5, and therefore, the heat dissipation capability of the semiconductor chip 7 may be reduced.

However, in the semiconductor device according to the first embodiment in which the joint edge 8 of the housing 1a is regulated to have the arc-shape, since the insulated circuit board (3a, 3b, 3c) is forced to curve in the positive-warpage with the warpage amount w, it is possible to solve the problems of a curving direction and a warpage amount of the insulated circuit board (3a, 3b, 3c) which are caused by differences in various device specifications. As a result, it is possible to stably hold the positive-warpage shape of the insulated circuit board (3a, 3b, 3c).

Figure 9:
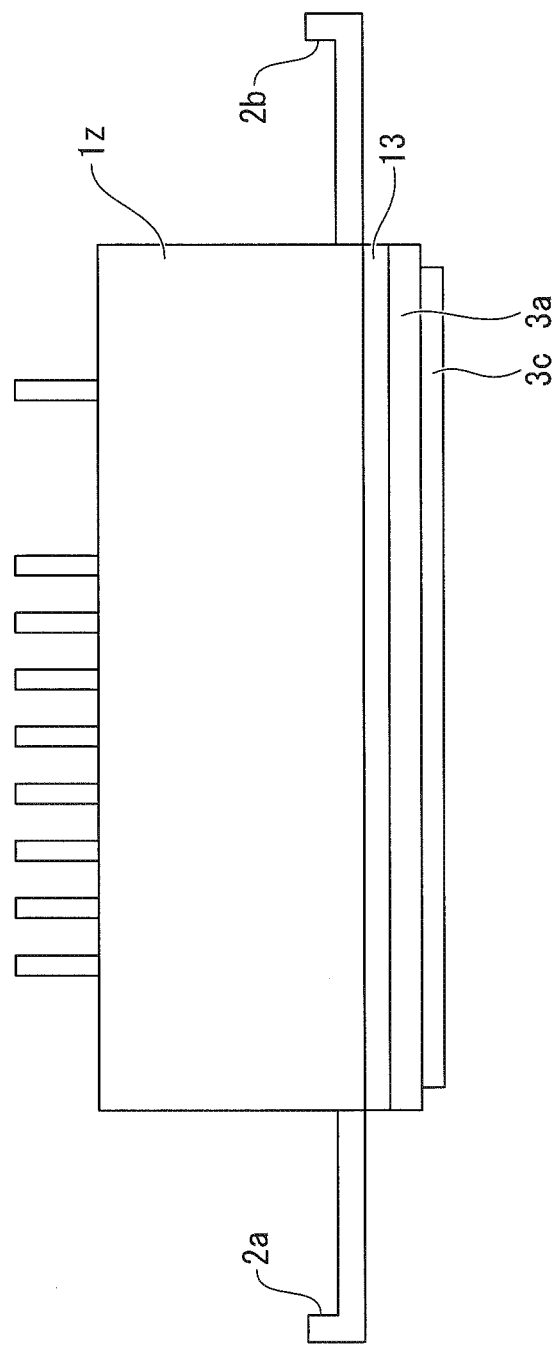
FIG. 9 is a schematic side view illustrating a configuration of a semiconductor device according to a comparative example.
Figure 10:
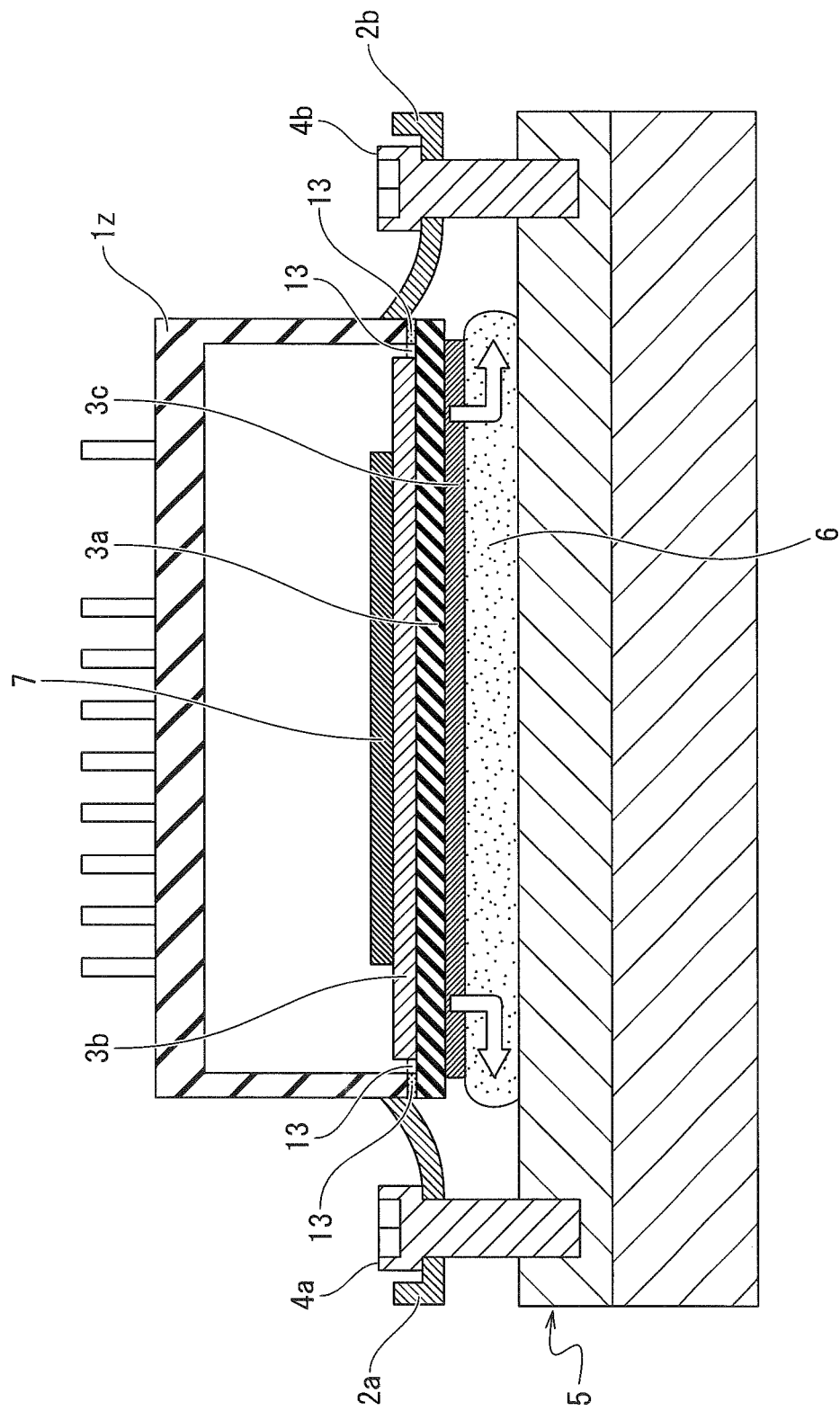
FIG. 10 is a cross-sectional view illustrating an internal structure of the semiconductor device when the semiconductor device according to the comparative example is attached to the cooler.

Further, the semiconductor device according to the comparative example will be examined. As illustrated in FIG. 9, in the semiconductor device according to the comparative example, a shape of each of the lower edges of the side-walls in a rectangular-parallelepiped housing 1z is not regulated, and the joint edges which are jointed with the insulated circuit board (3a, 3b, 3c) located in the lower edges, are not adjusted in an arc-shape but remains flat in a horizontal direction. Therefore, as illustrated in FIG. 10, the peripheral region of the insulated circuit board (3a, 3b, 3c) jointed to lower edges of the side-walls of the housing 1z is not forced to curve in the positive-warpage and the insulated circuit board (3a, 3b, 3c) remains also flat. Since the other structures of the semiconductor device according to the comparative example are equivalent to the corresponding structures in the semiconductor device according to the first embodiment, respectively, the redundant description will be omitted.

Figure 11:
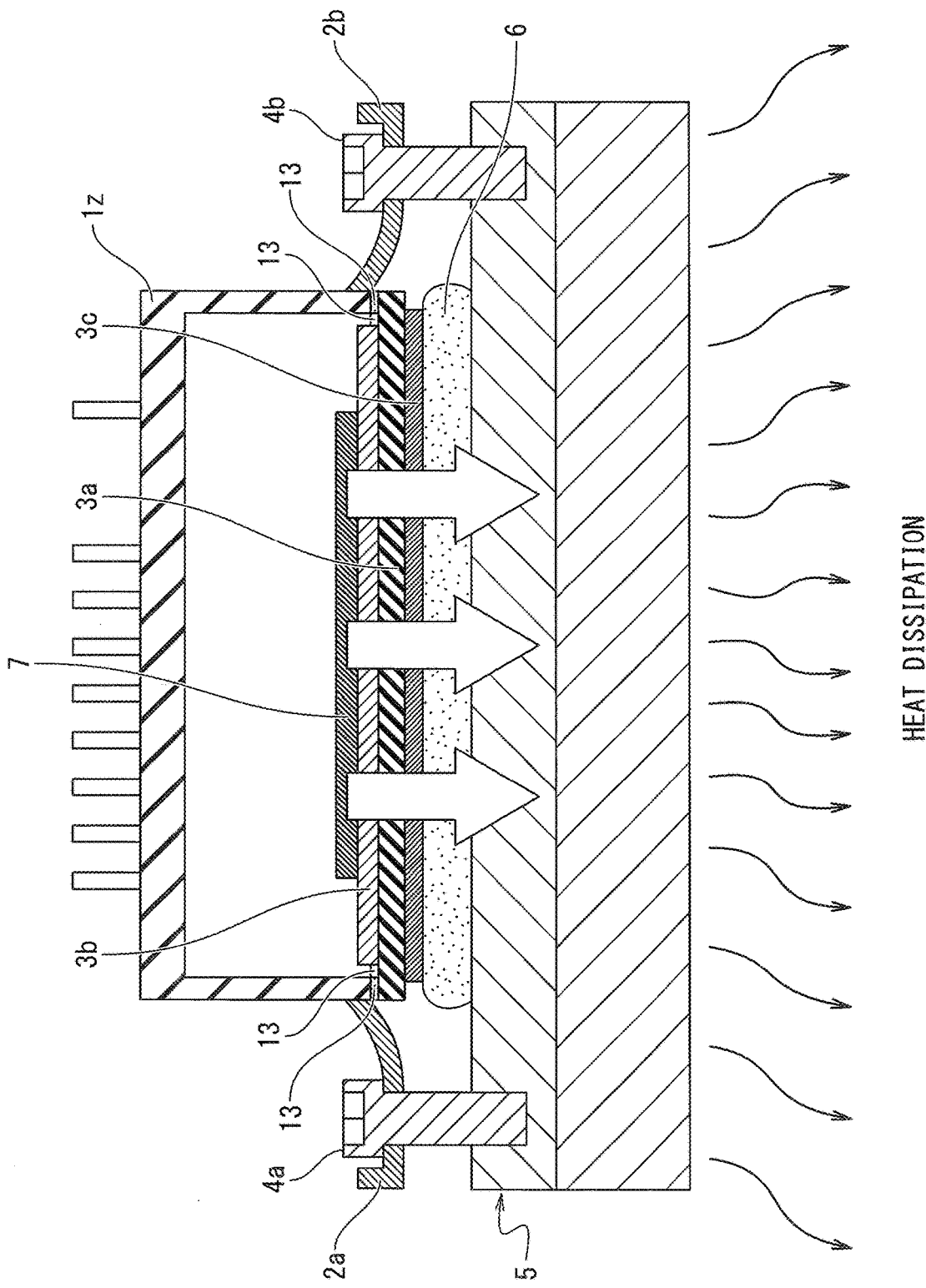
FIG. 11 is a cross-sectional view illustrating a heat dissipation from the semiconductor device according to the comparative example to the cooler when the semiconductor device is attached to the cooler.
Figure 12:
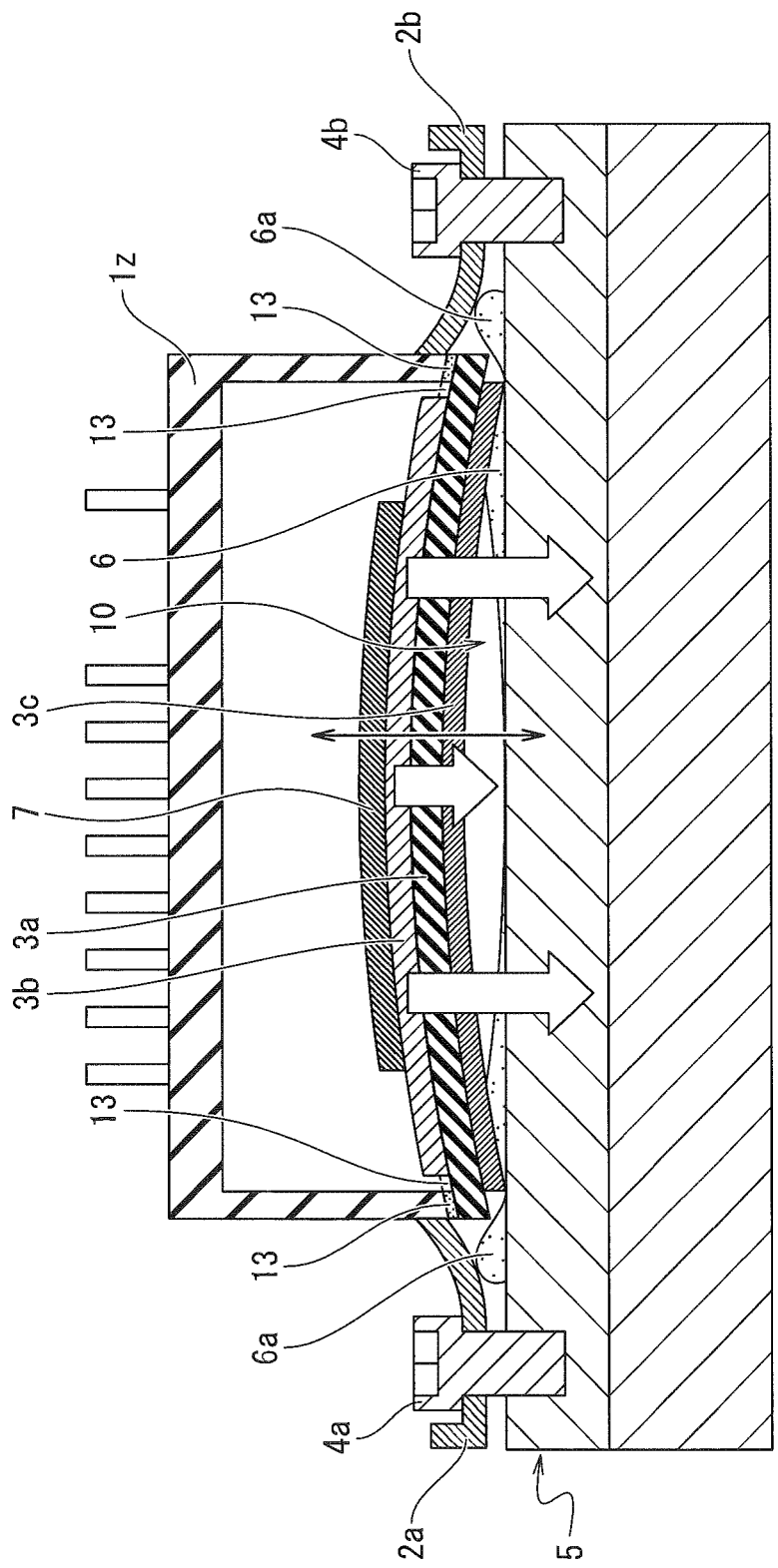
FIG. 12 is a cross-sectional view illustrating a deterioration of the heat dissipation performance from the semiconductor device according to the comparative example to the cooler after loading a heat cycle to the semiconductor device attached to the cooler.

Even in the semiconductor device according to the comparative example, as illustrated in FIG. 11, when heat is generated by the operation of the semiconductor chip 7, the generated heat is transmitted to the cooler 5 provided in the lower position via the thermal grease 6, and dispersed to the outside via the heat-radiation plates 5a, 5b, . . . . However, when a heat cycle is applied to the insulated circuit board (3a, 3b, 3c), the shape of the insulated circuit board (3a, 3b, 3c) changes in the negative-warpage direction due to difference in the thermal expansions. Then, as illustrated in FIG. 12 by a bidirectional arrow labeled in the center of the semiconductor device, the positive-warpage and the negative-warpage repeatedly occur, and a heat conduction portion may be lost around the center of the insulated circuit board (3a, 3b, 3c) to generate the gap 10. Further, as exemplified at both ends on the bottom of the housing 1z in FIG. 12, a thermal grease 6a, which is a part of the thermal grease 6, may pump out from the jointed interface between the insulated circuit board (3a, 3b, 3c) and the cooler 5 to the outside.

In the semiconductor device according to the first embodiment, the insulated circuit board (3a, 3b, 3c) is jointed to the joint edges 8 provided on the lower edges of the shorter side-walls of the housing 1a and intentionally regulated in the arc-shape, so that the insulated circuit board (3a, 3b, 3c) may be forced to curve downward in the positive-warpage. Thus, even when a heat cycle is applied to the insulated circuit board (3a, 3b, 3c), so that the insulated circuit board (3a, 3b, 3c) is forced to curve upward in the negative-warpage due to difference in the thermal expansions, as illustrated in FIG. 7, shape-changing of the insulated circuit board (3a, 3b, 3c) can be definitely prevented, and the negative-warpage may not occur. Therefore, heat dissipation capability of the semiconductor device can be improved. In particular, in the case of a semiconductor device having a baseless structure for heat dissipation, the effectiveness that the insulated circuit board (3a, 3b, 3c) may not be in the negative-warpage becomes remarkable.

Further, in the semiconductor device according to the first embodiment, the housing 1a, which is a source of force to the insulated circuit board (3a, 3b, 3c), is made of resin having high insulating property, because shape-changing of the housing 1a itself is suppressed, the shape-changing of the housing 1a may be very small even when the heat cycles are applied. Here, if lower edges of the shorter side-walls of the housing 1a are in an arc-shape to be convex upward, the insulated circuit board (3a, 3b, 3c) jointed to the lower edges via the joint edges, also has a shape in the negative-warpage. More specifically, the shapes of the lower edges of the housing 1a combined with the insulated circuit board (3a, 3b, 3c) via the joint edges greatly affects the shape of the insulated circuit board (3a, 3b, 3c). Therefore, in the semiconductor device according to the first embodiment, by intentionally regulating the shape of the lower edges of the shorter side-walls of the housing 1a in the arc-shape to be convex downward, the positive-warpage in the insulated circuit board (3a, 3b, 3c) jointed via the joint edges 8 may be stably kept over the long term. As a result, high heat-dissipation capability can be maintained.

Further, since the housing 1a can be fabricated by mass-production using injection molding or the like, there is hardly any manufacturing difference in each of the individual products. Therefore, the effectiveness of holding the shape of the positive-warpage in the insulated circuit board (3a, 3b, 3c) for a long period by the housing 1a can be applied to a large amount of semiconductor devices.

Further, in the semiconductor device according to the first embodiment, because the cooler-side conductive-foil 3c, which has a larger volume than the chip-side conductive-foil 3b bonded on the chip-side main-surface, is bonded on the cooler-side main-surface of the insulating substrate 3a of the insulated circuit board (3a, 3b, 3c), by using the difference in extension amount due to the difference in thermal expansion, it is easy to curve the insulating substrate 3a to protrude downward, thereby stability of the positive-warpage in the insulated circuit board (3a, 3b, 3c) can be improved.

Further, in the semiconductor device according to the first embodiment, as illustrated in FIG. 5, the heat-radiation plates 5a, 5b, . . . , which extend in a direction parallel to the shorter side-walls of the housing 1a, are arranged in parallel with equal intervals toward the bottom of the insulated circuit board (3a, 3b, 3c), being orthogonal to the longer side-walls of the housing 1a. Therefore, a number of the heat-radiation plates 5a, 5b, . . . that vertically intersect with the proximity area C1, which extends in the bar-shape along the longer side-wall of the housing 1a, can be maximized. Therefore, it is possible to transmit the heat dissipated inside the housing 1a around the proximity area C1, to a greater number of the heat-radiation plates 5a, 5b, . . . . As a result, it is possible to prevent unbalance of heat dissipation from the semiconductor module to the cooler 5 so as to achieve leveling of the heat dissipation, and to efficiently dissipate heat as a whole.

—Manufacturing Method of Semiconductor Device—

Next, a manufacturing method of the semiconductor device according to the first embodiment illustrated in FIGS. 1 to 7 will be exemplarily described with reference to FIGS. 13 and 14. First, the insulated circuit board (3a, 3b, 3c) which has been subjected to solder plating or the like on a predetermined region on the surface by a printing technique or the like is prepared. Then, as shown in the lower part of FIG. 13, the semiconductor chip 7 and other predetermined parts are mounted on the insulated circuit board (3a, 3b, 3c).

Figure 13:
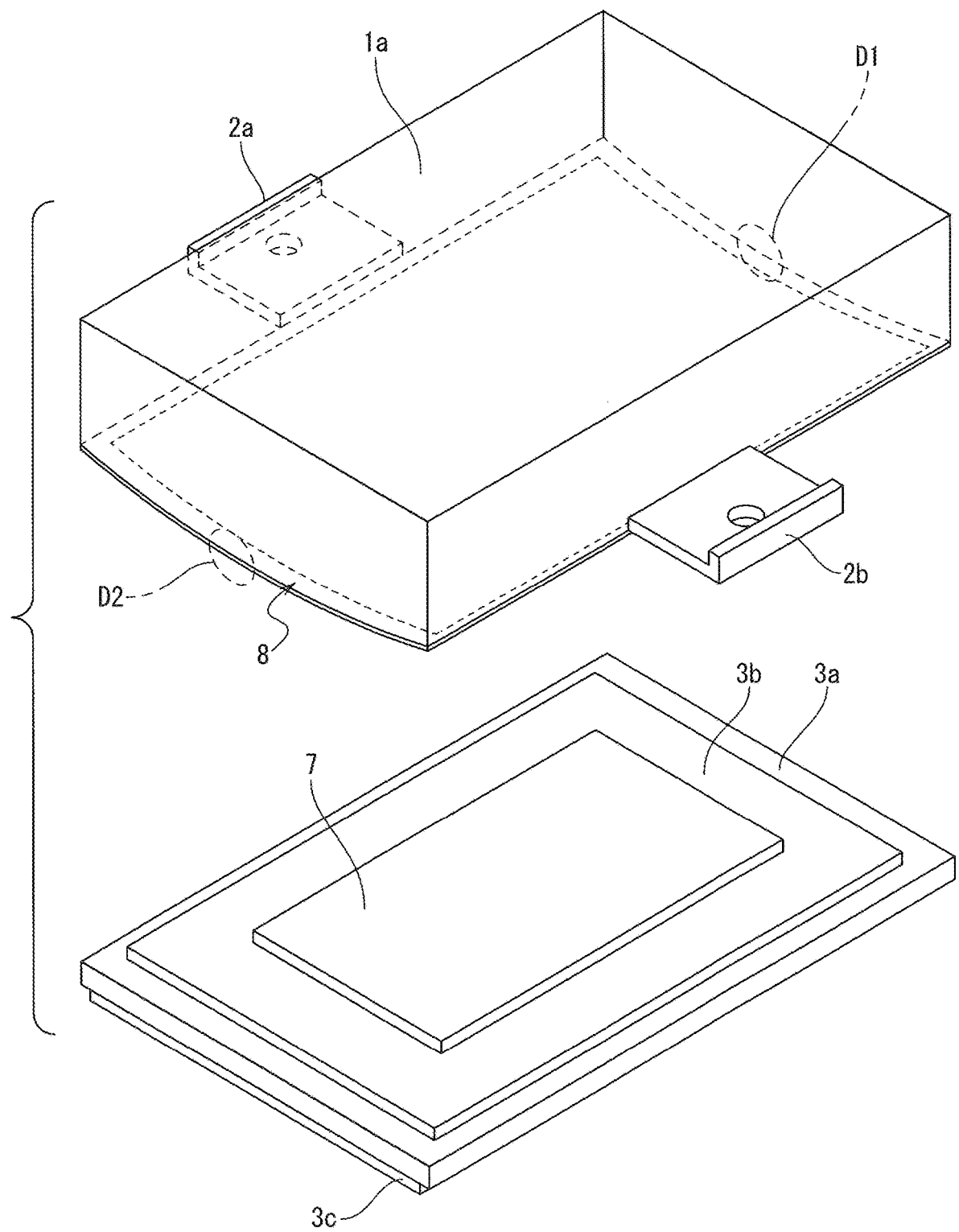
FIG. 13 is a schematic perspective view illustrating a manufacturing method for a semiconductor device according to the first embodiment, —part 1—.

Next, as shown in the upper part of FIG. 13, the housing 1a having pairs of facing side-walls, which is jointed to the periphery of the insulated circuit board (3a, 3b, 3c) by using each lower edges of the side-walls as the joint edges 8, is prepared. Each lower edge of the facing shorter side-walls of the housing 1a has an arc-shape such that a center in an extending direction of the lower edge of the shorter side-wall protrudes toward the insulated circuit board (3a, 3b, 3c) from both ends of the extending direction of the lower edge so as to curve to be convex. Next, the insulated circuit board (3a, 3b, 3c) is aligned so as to be installed in a lower inner-side of the housing 1a. Further, although illustration is omitted, an adhesive 13 is applied to the joint edges 8 of the side-walls of the housing 1a.

Figure 14:
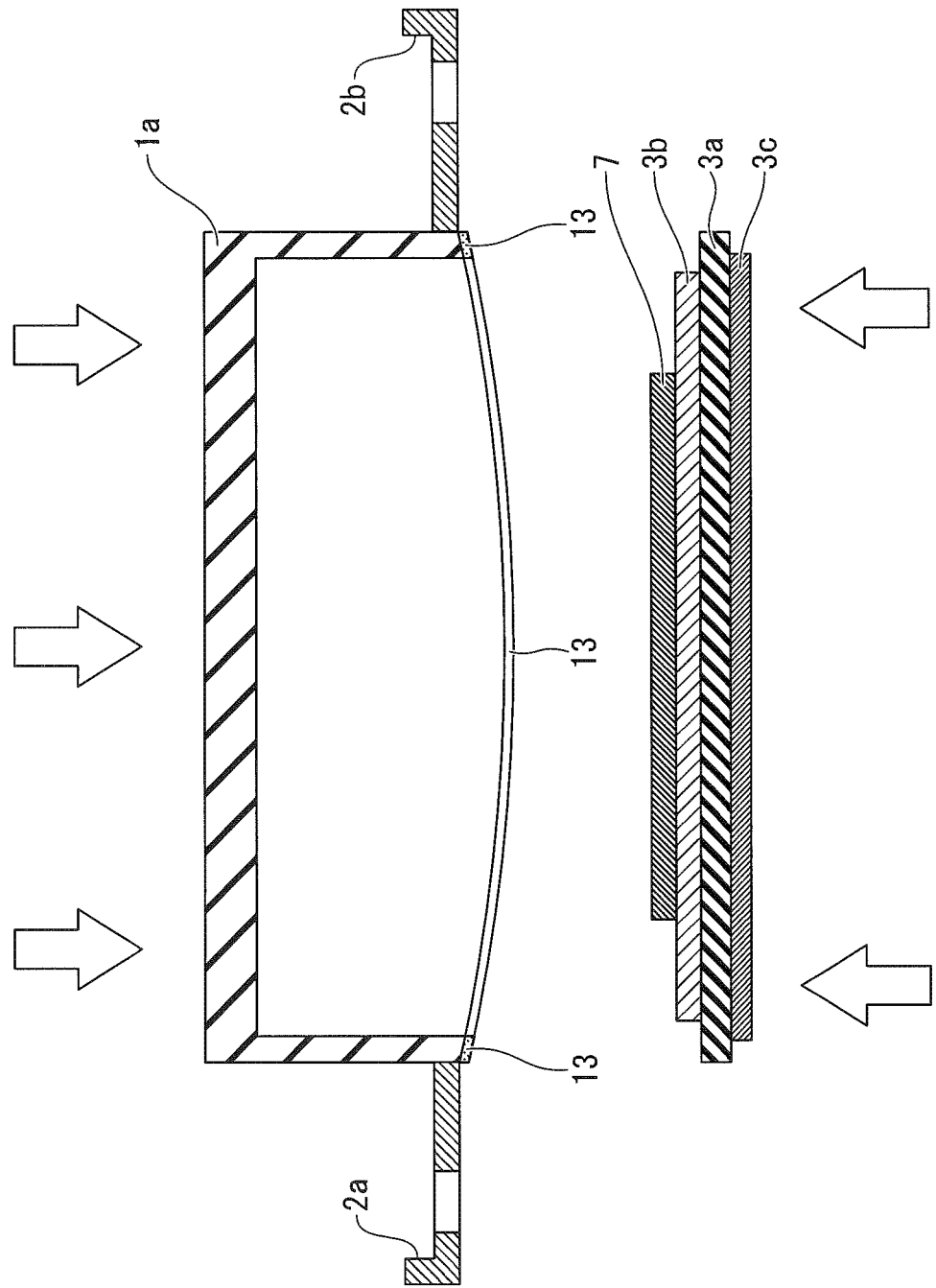
FIG. 14 is a schematic cross-sectional view illustrating the manufacturing method for the semiconductor device according to the first embodiment, —part 2—.

Next, as illustrated in FIG. 14, the insulated circuit board (3a, 3b, 3c) and the housing 1a are pressed and jointed via the joint edges 8 on the lower edges of the side-walls of the housing 1a. Then, the top of the insulated circuit board (3a, 3b, 3c) and the bottom of the housing 1a are pressed to cure the adhesive 13, and thus the insulated circuit board (3a, 3b, 3c) and the housing 1a are jointed. The insulated circuit board (3a, 3b, 3c) follows from each shape of the lower edges of the side-walls so as to force to curve in a positive-warpage in the shorter side-walls of the housing 1a with warpage amount w of about 100 micrometers or less by jointing via the joint edges 8 of the lower edges of the side-walls having the arc-shape.

Next, surfaces of electrodes, such as an output electrode, a gate electrode and the like, of the semiconductor chip 7 are connected to predetermined connection terminals provided on the housing 1a using a connecting member, such as a bonding wire, a lead frame and the like. It should be noted that, since the known technology can be used in subsequent processes after the connecting process of the semiconductor chip 7 and the connecting terminals, illustration is omitted. When the lead frame or the like is used, for example, a solder plating processing on the surface of the electrode or the like by a printing technique or the like, a soldering using a nitrogen gas or the like, and a predetermined cleaning processing or the like are appropriately executed. Then, a protective filler, such as a silicone gel, an epoxy resin and the like, is filled into the housing 1a, and hardened to a predetermined hardness so as to seal inside of the housing 1a, and thus, a semiconductor module is fabricated.

Next, the thermal grease 6 is applied on a cooler 5. Then, the fabricated semiconductor module is attached to the cooler 5 using the first attachment screw 4a and the first attachment plate 2a, and the second attachment screw 4b and the second attachment plate 2b. During the attachment, as illustrated in FIG. 5, the cooler-side main-surface of the insulated circuit board (3a, 3b, 3c) being curved in the positive-warpage pushes out the thermal grease 6 from the center to the outside. Through the series of processes described above, the semiconductor device according to the first embodiment can be obtained.

In the manufacturing method of the semiconductor device according to the first embodiment, the insulated circuit board (3a, 3b, 3c) is forced to curve in the positive-warpage using the joint edges 8, which are provided on the lower edges of the shorter side-walls of the housing 1a, the lower edges are formed to curve respectively in a shape to protrude to be convex downward. Therefore, it is possible to manufacture a semiconductor device having the baseless structure in which, even if a heat cycle occurs, shape-changing of the insulated circuit board (3a, 3b, 3c) may be prevented and heat dissipation may be improved.

Further, in the manufacturing method of the semiconductor device according to the first embodiment, the insulated circuit board (3a, 3b, 3c) which curves in the positive-warpage and protrudes to be convex toward the thermal grease 6, which is provided at the cooler-side main-surface of the insulated circuit board (3a, 3b, 3c), is used. Therefore, when joining the insulated circuit board (3a, 3b, 3c) and the thermal grease 6, wettability and spreading properties of the thermal grease 6 may be improved, and a thickness of the thermal grease 6 can be made thinner than earlier assembling scheme of the semiconductor devices. Therefore, while reducing the overall used amount of the thermal grease 6, it is possible to effectively dissipate heat during operation of the semiconductor tip 7 to the outside.

Particularly, in the manufacturing method of the semiconductor device according to the first embodiment, a spring effect occurs in the first attachment portion and the second attachment portion respectively provided at the centers of the lower edges of the longer side-walls in the housing 1a. By combining the spring effect to the jointing via the joint edges 8 of the housing 1a having the side-walls in which the lower edges curve to protrude to be convex downward, it is possible to push out the thermal grease 6 more easily.

Moreover, the first attachment plate 2a and the second attachment plate 2b are provided at the centers of the longer side-walls of the housing 1a which is used in the manufacturing method of the semiconductor device according to the first embodiment. Here, for example, in the housing 1z, as illustrated in FIG. 10, in which the lower edges of the side-walls are flat, jointing force where the first attachment plate 2a and the second attachment plate 2b are provided at the centers of the side-walls in the longer side-walls will be considered for comparison. In the housing 1z having the flat lower edges of the side-walls, when the semiconductor module is attached to the cooler 5, since the stress in the center region of each shorter side-wall of the housing 1z becomes smaller than that in the other regions, the jointing force between the housing 1z and the insulated circuit board (3a, 3b, 3c) is decreased.

However, in the manufacturing method of the semiconductor device according to the first embodiment, as illustrated in FIG. 13, the shapes of the central portions D1, D2 at the lower edges of the side-walls in the pair of shorter side-walls of the housing 1a protrudes so as to curve to be convex downward from regions at both ends in the left and right direction. Therefore, when the first attachment plate 2a and the second attachment plate 2b are used, the jointing force between the housing 1a and the insulated circuit board (3a, 3b, 3c) can be increased.

(First Modification)

Figure 15:
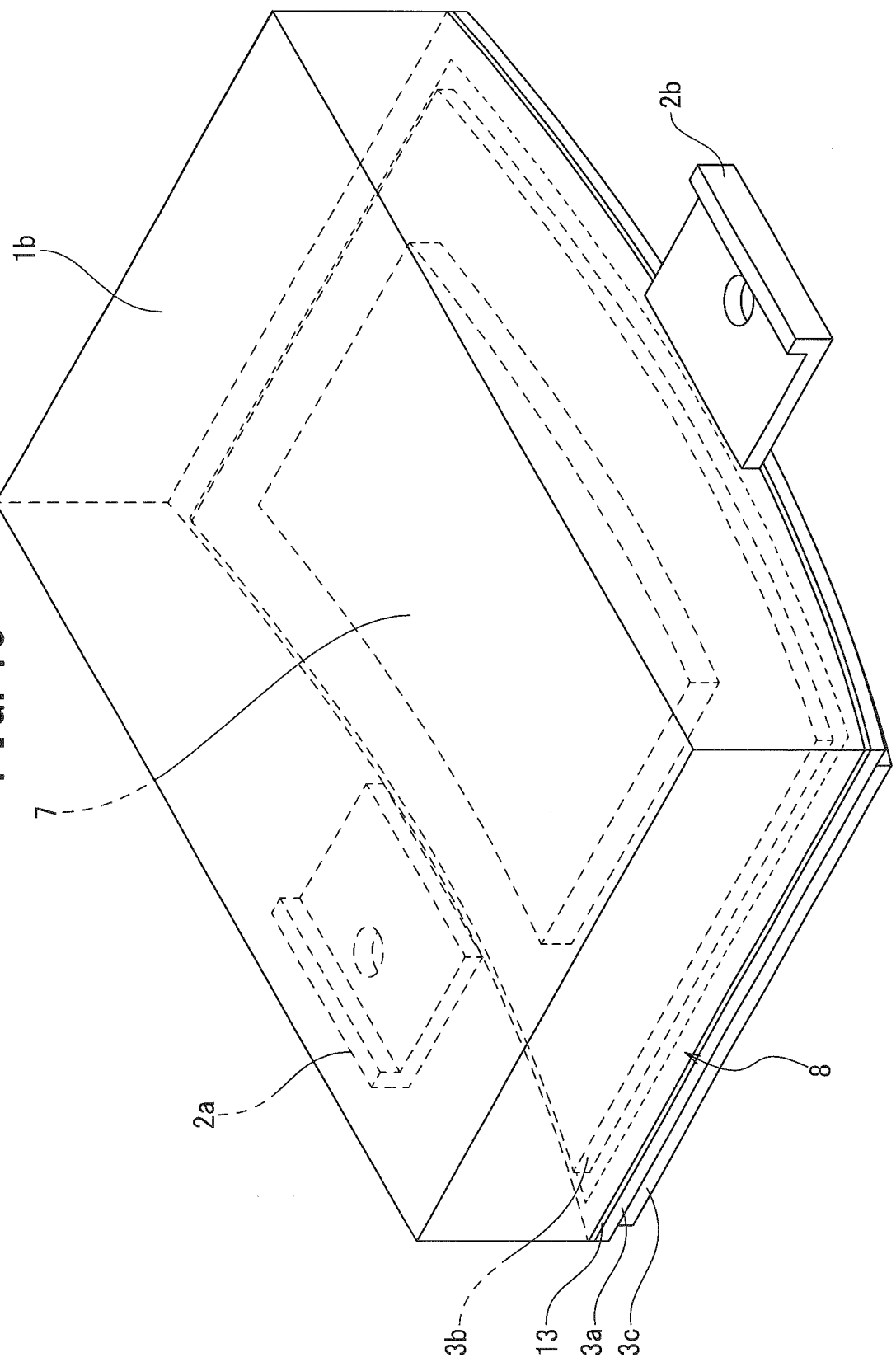
FIG. 15 is a schematic perspective view illustrating a configuration of a semiconductor device according to a first modification of the first embodiment.
Figure 16:
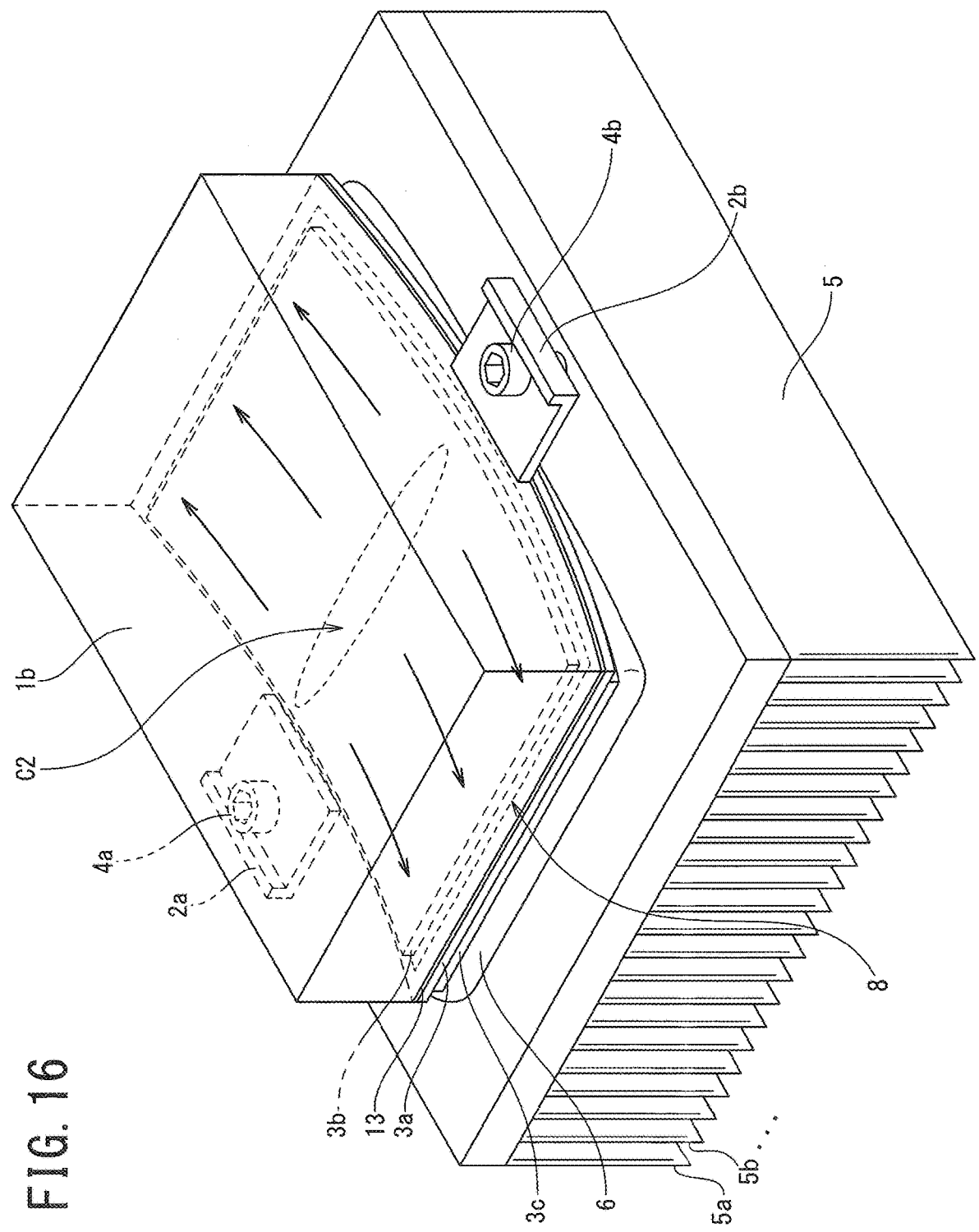
FIG. 16 is a schematic perspective view illustrating a state in which a thermal grease is pressed and spread out from a center to an outer side when the semiconductor device according to the first modification is attached to a cooler.

In the housing 1a of the semiconductor device illustrated in FIG. 1, the lower edges of the shorter side-walls of the housing 1a are assigned to the joint edges 8 and formed in the arc-shape. However, even when the lower edges of the shorter side-walls is not formed into the arc-shape, it is possible to achieve the same effectiveness as the semiconductor device according to the first embodiment. For example, as a housing 1b of a semiconductor device according to a first modification illustrated in FIG. 15, lower edges of a pair of longer side-walls of the housing 1b may be curved in an arc-shape such that the centers of the lower edges in the longer side-walls protrude to be convex toward the insulated circuit board (3a, 3b, 3c). When a main-surface of the side-wall in the longer side-wall is viewed from the front, the lower edges of the side-walls, which is assigned to the joint edge 8, appears in an arc-shape. As illustrated in FIG. 16, the thermal grease 6 is pressed and spread in an extending direction of the shorter side-wall from a proximity area C2, which extends in a bar-shape along the shorter side-wall, approximately in the center of the shorter side-wall between the opposite longer side-walls of the insulated circuit board (3a, 3b, 3c). In a layer of the thermal grease 6, a thickness of a region in contact with the proximity area C2 in the insulated circuit board (3a, 3b, 3c), is the thinnest as compared with the other regions. Since the other structures of the semiconductor device according to the first modification are equivalent to the constituent members having the same name in the semiconductor device according to the first embodiment, respectively, the redundant description will be omitted. Even in the semiconductor device according to the first modification, by jointing via the joint edges 8 in the lower edges of the side-walls of the housing 1b in which the lower edges of the longer side-walls are curved so as to protrude to be convex to the bottom direction, the insulated circuit board (3a, 3b, 3c) is forced to curve in the positive-warpage toward the cooler 5 allocated at the cooler-side main-surface of the insulated circuit board (3a, 3b, 3c).

(Second Modification)

Figure 17:
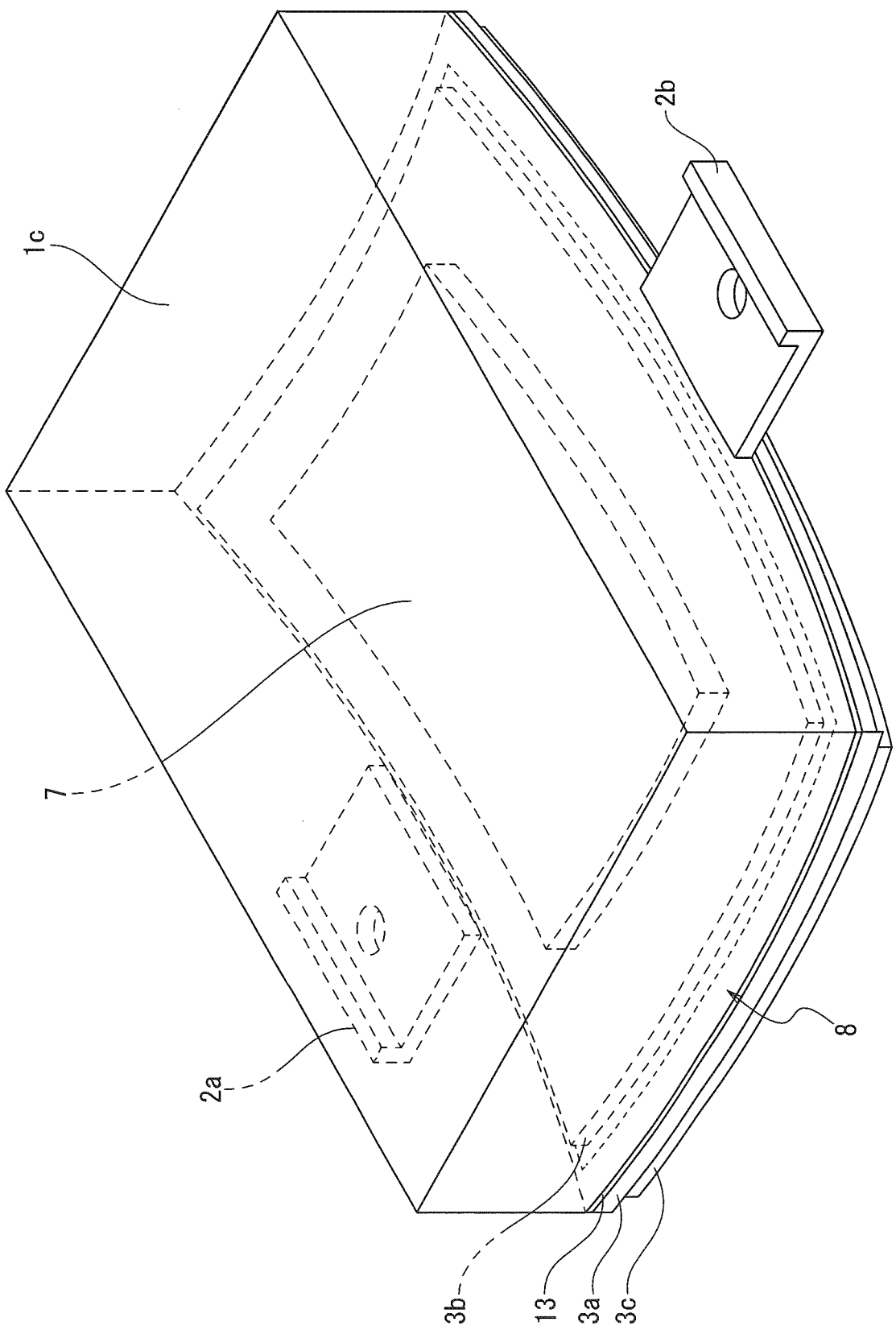
FIG. 17 is a schematic perspective view illustrating a configuration of a semiconductor device according to a second modification of the first embodiment.
Figure 18:
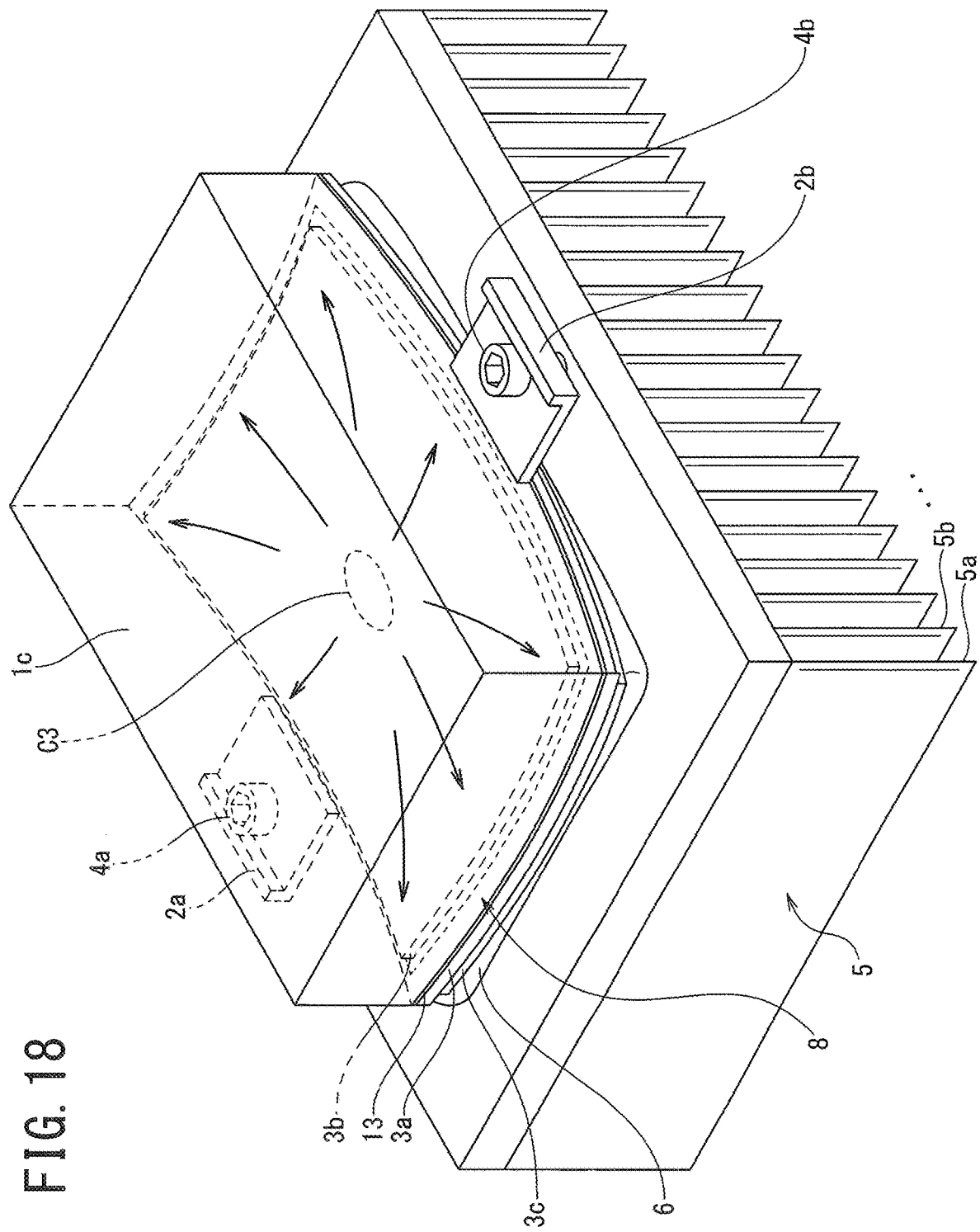
FIG. 18 is a schematic perspective view illustrating a state in which a thermal grease is pressed and spread out from a center to an outer side when the semiconductor device according to the second modification is attached to a cooler.

In addition, as a housing 1c of a semiconductor device according to a second modification illustrated in FIG. 17, even when all of lower edges of the four side-walls of the housing 1c, to which the joint edges 8 are assigned, are curved in arc-shapes so as to protrude to be convex toward the insulated circuit board (3a, 3b, 3c), it is also possible to achieve the same effectiveness as the semiconductor device according to the first embodiment. When main-surfaces of the side-walls in longer side-walls and shorter side-walls of the housing 1c are viewed from the front, respectively, the joint edges 8, which assign to the lower edges of the respective side-walls, appear in arc-shapes. As illustrated in FIG. 18, the thermal grease 6 is pushed out from a proximity area C3 located at the center of the insulated circuit board (3a, 3b, 3c) toward the four peripheral sides, and in a layer of the thermal grease 6, a thickness of a region in contact with the proximity area C3 in the insulated circuit board (3a, 3b, 3c) is the thinnest as compared with the other regions. Since the other structures of the semiconductor device according to the second modification is equivalent to the constituent members having the same name in the semiconductor device according to the first embodiment, the redundant description will be omitted. Also in the semiconductor device according to the second modification, as illustrated in FIG. 18, via the joint edges 8 assigned to the lower edges of the four side-walls of the housing 1c in which the lower edges of the four side-walls are curved so as to protrude to be convex to the bottom direction, the insulated circuit board (3a, 3b, 3c) is forced to curve in the positive-warpage toward the cooler 5, which is allocated at the cooler-side main-surface of the insulated circuit board (3a, 3b, 3c).

(Second Embodiment)

Figure 19:
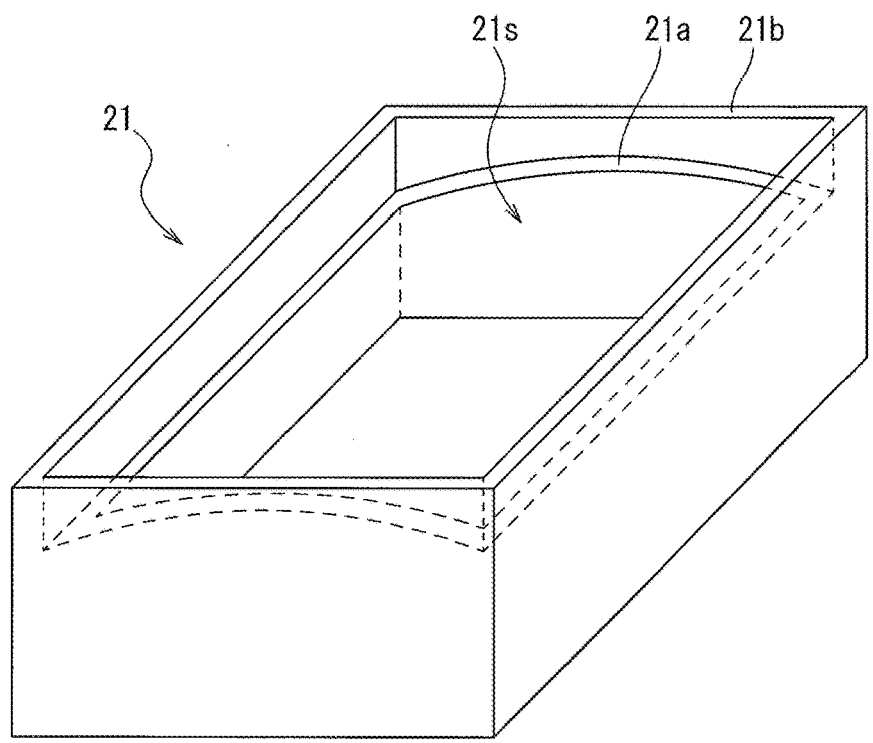
FIG. 19 is a schematic perspective view as seen from a back side which is a cooler side, illustrating a configuration of a case used in a semiconductor device according to a second embodiment.

A semiconductor device according to a second embodiment includes an insulated circuit board having a rectangular-shape, on which a semiconductor chip is mounted, and a housing 21 having a rectangular-parallelepiped topology, which has an inner case 21a, jointed to a periphery of the insulated circuit board as illustrated in FIG. 19, in which upper edges of the inner case 21a are assigned to joint edges, respectively.

Figure 20:
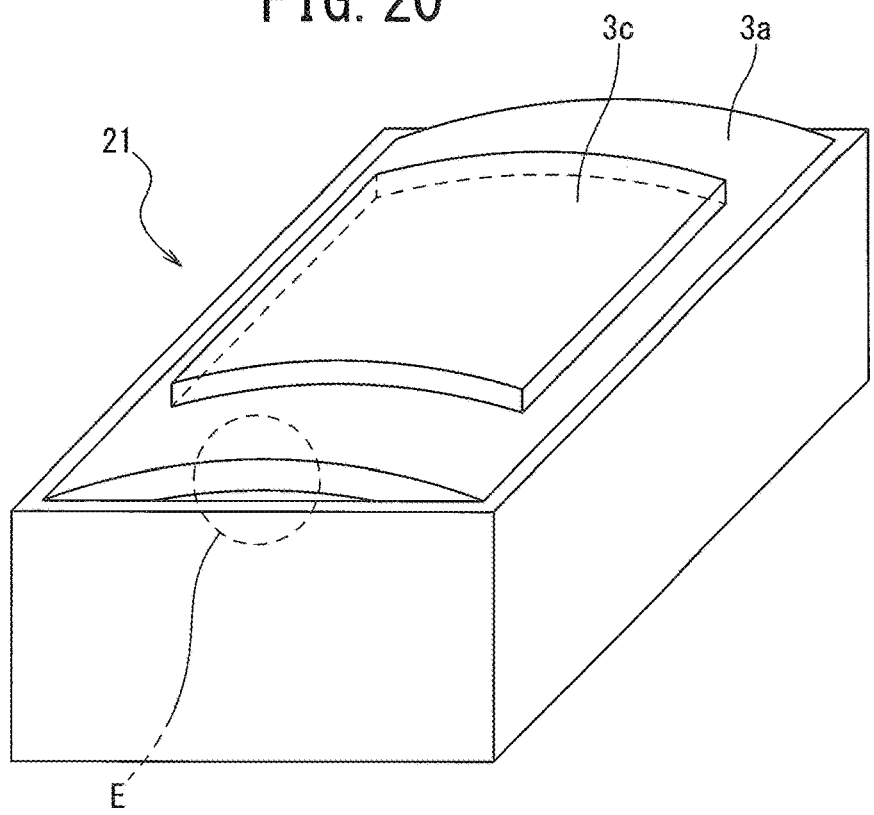
FIG. 20 is a schematic perspective view as seen from the back side, illustrating a configuration of the semiconductor device according to the second embodiment.

The side-walls of the housing 21 include the inner case 21a and a supporting case 21b which is provided in contact with the inner case 21a on outsides of the inner case 21a. As illustrated in FIG. 20, a semiconductor module is assembled by placing the insulated circuit board in an inner region of the housing 21 surrounded by the supporting case 21b and inner-wall faces 21s of the inner case 21a, and the peripheral region of the insulated circuit board contacts the upper edges of the inner case 21a. In FIG. 20, for the sake of illustration, the insulating substrate 3a and the cooler-side conductive-foil 3c are positioned at the top side of the semiconductor module. Since the cooler is mounted on a top surface of the cooler-side conductive-foil 3c in FIG. 20, the insulated circuit board (3a, 3b, 3c) is curved so as to protrude to be convex toward the cooler, that is, in FIGS. 19 and 20, the housing 21 and the insulated circuit board are exemplified as being upside down from the semiconductor device of the first embodiment illustrated in FIGS. 1 to 18 so that the cooler-side conductive-foil 3c of the insulated circuit board faces upward. In the semiconductor device according to the second embodiment, upper edges of a pair of shorter side-walls among the four side-walls of the inner case 21a are assigned to the joint edges, which correspond to the lower edges of the shorter side-walls of the housing 1a in the semiconductor device according to the first embodiment.

As illustrated in FIG. 19, the four upper edges of the inner case 21a implement a rectangular frame. The joint edges which are positioned on the upper edges of the pair of shorter side-walls, which are facing two side-walls among the four side-walls of the inner case 21a, are curved in the arc-shape so that the centers in an extending direction of the facing two side-walls protrude from the both ends of the two side-walls to be convex toward the insulated circuit board, as same as those of the semiconductor device according to the first embodiment. As illustrated in FIG. 19, the supporting case 21b of the housing 21 is higher than the inner case 21a and integrally provided in the outside of the inner case 21a in the four side-walls of the housing 21. Since the inner case 21a and the supporting case 21b have different heights, at the top of the housing 21 appearing on the upper edge in FIG. 19, a step is formed by the upper edges of the inner case 21a and vertical faces of the side-walls of the supporting case 21b. The semiconductor device according to the second embodiment is different from the semiconductor device according to the first embodiment having the housing 1a in that the step is provided by the supporting case 21b.

Figure 21:
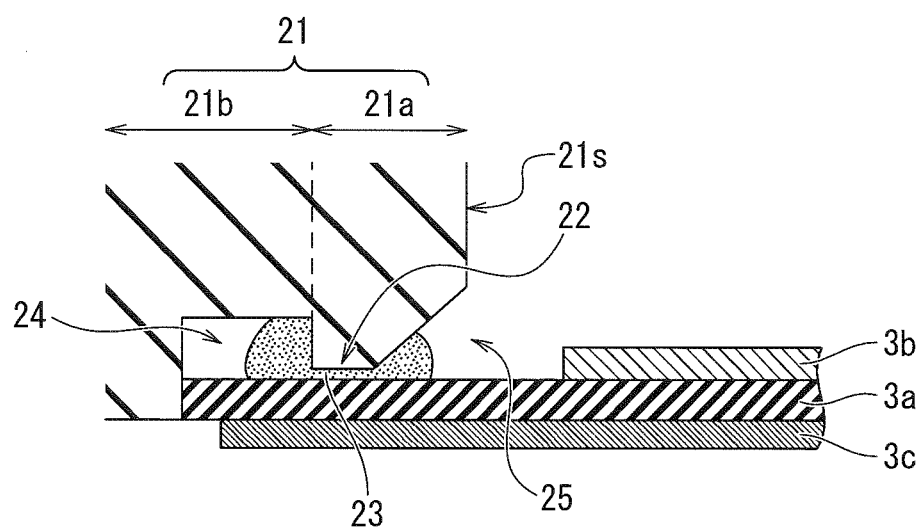
FIG. 21 is an enlarged cross-sectional view of a portion E in FIG. 20, which is sectioned in a plane orthogonal to a shorter side-wall direction of the case in upside-down arrangement.

FIG. 21 is a partial sectional view of the housing 21, corresponding to a portion E in FIG. 20, in which the insulated circuit board (3a, 3b, 3c) is housed in a state where the edge of the insulated circuit board (3a, 3b, 3c) is fitted to the step of the side-wall (21a, 21b) of the housing 21. By jointing the insulated circuit board (3a, 3b, 3c) with the upper edge of the inner case 21a via an adhesive 23, the insulated circuit board (3a, 3b, 3c) is supported at the chip-side main-surface of the insulated circuit board (3a, 3b, 3c), as illustrated in the left end position in FIG. 21. In addition, as exemplified in the contact state between a left edge of the insulating substrate 3a and a vertical face of the supporting case 21b illustrated in the left side in FIG. 21, the insulated circuit board (3a, 3b, 3c) is also supported by the supporting case 21b at the edges of the insulating substrate 3a.

In FIG. 21, a joint portion 22 which is a part of a joint edge between the insulating substrate 3a and the inner case 21a of the housing 21 is illustrated. The joint portion 22 is formed around parallel opposed faces between a horizontal face of lower edge of the inner case 21a and the chip-side main-surface of the insulating substrate 3a. On the left side of the joint portion 22 in FIG. 21, between the left edge side portion of the chip-side main-surface of the insulating substrate 3a and the supporting case 21b of the housing 21, a relatively large air gap having a rectangular cross section is formed as an outer pocket 24.

Also, as illustrated upside down in FIG. 21, in a transition region from the inner-wall faces 21s of the inner case 21a to the joint portion 22, an inclined face is formed such that a thickness of the inner case 21a decreases from the inner side to the outer side as approaching to the chip-side main-surface of the insulating substrate 3a. On the right side of the joint portion 22 in FIG. 21, between the inclined face and the chip-side conductive-foil 3b, a relatively large air gap having a triangular cross section is formed as an inner pocket 25.

The adhesive 23 is provided so as to reside over the joint portion 22, the outer pocket 24 and the inner pocket 25. The adhesive 23 in the inner pocket 25 and the chip-side conductive-foil 3b located inside the inner pocket 25 are spaced apart from each other so as not to be in contact with each other. Therefore, the joint portion 22 and the circuit pattern formed on the chip-side conductive-foil 3b do not come into contact with each other via the adhesive 23. Further, the cooler-side conductive-foil 3c extends to the vicinity of the left end of the insulating substrate 3a so that the left edge on the side of the housing 21 in FIG. 21 is located outside the joint portion 22.

Since the other structures of the semiconductor device according to the second embodiment is equivalent to the corresponding structures in the semiconductor device according to the first embodiment, the redundant description will be omitted. Although not illustrated in FIGS. 19 to 21, the first attachment plate 2a and the second attachment plate 2b may be provided in the housing 21 as in the case of the semiconductor device according to the first embodiment.

In the semiconductor device according to the second embodiment, similarly to the case of the semiconductor device according to the first embodiment, the insulated circuit board (3a, 3b, 3c) is forced to curve in the positive-warpage toward the cooler, by jointing via the joint edge provided on the upper edges in the side-walls of the housing 21 in which the upper e edges in the side-walls are curved so as to protrude upward to be convex. Therefore, even if a heat cycle occurs, change in shape of the insulated circuit board (3a, 3b, 3c) can be prevented, and the heat dissipation performance may be improved.

Further, in the semiconductor device according to the second embodiment, the position of the insulated circuit board (3a, 3b, 3c) is guided by the supporting case 21b provided on the outermost side of the housing 21, and the contacting area between the insulated circuit board (3a, 3b, 3c) and the housing 21 increases. Therefore, the stress applied to the insulated circuit board (3a, 3b, 3c) from the housing 21 can be dispersed.

Further, in the semiconductor device according to the second embodiment, by providing the outer pocket 24 and the inner pocket 25 capable of storing the adhesive 23 around the joint portion 22, it is possible to prevent the adhesive 23 overflowing from the side end of the insulating substrate 3a to the outside of the housing 21. Therefore, it is possible to suppress deterioration of wettability and spreading properties of the thermal grease by forming a wall of the adhesive 23 when attaching to the cooler 5 due to the overflow of the adhesive 23.

Further, in the semiconductor device according to the second embodiment, not only via the adhesive 23 of the joint portion 22 but also via the adhesive 23 contained in the outer pocket 24 and the inner pocket 25 on both sides of the joint portion 22, the housing 21 and the insulated circuit board (3a, 3b, 3c) are jointed. Therefore, the jointing force between the housing 21 and the insulated circuit board (3a, 3b, 3c) can be increased.

Further, in the semiconductor device according to the second embodiment, since the joint portion 22 and the circuit pattern formed on the chip-side conductive-foil 3b do not come into contact with each other, it is possible to prevent the application of the heat cycle from being influenced to the joint portion 22 via the circuit pattern.

Further, in the semiconductor device according to the second embodiment, as illustrated upside down in FIG. 21, the cooler-side conductive-foil 3c extends to the vicinity of the edge of the insulating substrate 3a so as to overlap with the lower end of the inner case 21a, which serves as the joint edge of the inner case 21a, in the vertical direction. Therefore, since the strength of the entirety of the insulated circuit board (3a, 3b, 3c) may increase, it is possible to prevent the insulated circuit board (3a, 3b, 3c) from breaking due to the influence of stress from the joint edge. The other effects of the semiconductor device according to the second embodiment are the same as those of the semiconductor device according to the first embodiment.

(Third Embodiment)

As illustrated in FIG. 22, a semiconductor device according to a third embodiment includes an insulated circuit board on which a semiconductor chip is mounted, and a housing 31 having a joint edge jointed to the periphery of the insulated circuit board. In FIG. 22, illustration of the semiconductor chip is omitted. In addition, FIG. 22, the same as in FIGS. 19 and 20, illustrates the case 31 upside down for convenience of explanation.

In the semiconductor device according to the third embodiment, six rectangular-parallelepiped recesses are provided in the lower part, which is an upper part in FIG. 22, of one housing 31, and semiconductor modules 31a, 31b 31c, 31d, 31e, 31f are provided inside the six recesses, respectively. In four side-walls in each of the recesses, one pair of shorter side-walls where each upper edge of the side-walls is formed in an arc-shape so as to curve the insulated circuit board of the semiconductor modules 31a to 31f in a positive-warpage toward the cooler which is upper edge in FIG. 22, is included. Similarly to the semiconductor device according to the first embodiment, the upper edges of the shorter side-walls are implemented so that a center in an extending direction of the shorter side-wall curves and protrudes toward the insulated circuit board more than the both ends of the insulated circuit board so as to be convex downward.

Similarly as the side-wall (21a, 21b) of the housing 21 in the semiconductor device according to the second embodiment illustrated in FIG. 19, each wall portion, which implements a step in each of the six recesses, may be integrally achieved by an inner-wall and a supporting outer-wall. More specifically, the semiconductor device according to the third embodiment is characterized in that a plurality of structures, each of which is equivalent to the side-wall (21a, 21b) implementing the step explained in the housing 21 of the semiconductor device according to the second embodiment, are provided in the lower part in the one housing 31.

In FIG. 22, six insulating substrates 3a1, 3a2, 3a3, 3a4, 3a5, 3a6, which protrude so as be curved to be convex from the cooler-side main-surface of the semiconductor device to the cooler side, and six cooler-side conductive-foils 3c1, 3c2, 3c3, 3c4, 3c5, 3c6 are exemplified. The other structures of the semiconductor device according to the third embodiment are equivalent to the corresponding structures in the semiconductor devices according to the first and second embodiments, and thus the redundant description will be omitted.

In the semiconductor device according to the third embodiment, similarly to the semiconductor devices according to the first and second embodiments, each insulated circuit board is forced to curve in a positive-warpage toward the cooler side by jointing with the housing 31 via the joint edges, which are assigned to the upper edges of the side-walls in the housing 31 and is curved so as to protrude to be convex upward. Therefore, even if a heat cycle occurs, change in shape of the insulated circuit board can be prevented, and the heat dissipation performance may be improved.

Further, in the semiconductor device according to the third embodiment, since the plural semiconductor modules in each of which the heat dissipation property is improved, are integrated in the one housing 31, it is possible to increase capacity of the semiconductor device. The other effectiveness of the semiconductor device according to the third embodiment are the same as those of the semiconductor device according to the first and second embodiments.

(Other Embodiments)

While the present invention has been described by the above disclosed embodiments, it should be understood that the present invention is not intended to be limited to the descriptions of the Specification and the drawings implementing part of this disclosure. Various alternative embodiments, examples, and technical applications will be apparent to those skilled in the art according to this disclosure.

For example, in the first to third embodiments, the rectangular-parallelepiped housing, which appears as a rectangular shape in a planar pattern, has been described as a housing, but the shape of the housing is not limited to a rectangular-parallelepiped topology. Other three-dimensional shape, such as a hexagonal-columnar shape, an octagonal-columnar shape, or the like, in which side-walls provided in a pair of facing sides in a planar pattern, are included as regions to be jointed to peripheries of the insulated circuit board, may be used. Further, in the first to third embodiments, the housing having side-walls and a ceiling portion, in which one surface side as a bottom portion is opened, has been described as an example, but the ceiling portion may be a separate member from the side-walls. More specifically, the housing used in the semiconductor device according to the present invention may be mounted only by the side-walls.

In the first embodiment, the IGBT is described as an example of the semiconductor element which is the semiconductor chip 7, but in the present invention, the semiconductor element is not limited to the IGBT. For example, various semiconductor elements, such as MOSFETs, diodes and the like, which are used in semiconductor modules and generate heat, may be adopted. Moreover, the semiconductor device may include plural semiconductor elements.

Further, the semiconductor device according to the present invention may be achieved by partially combining the configurations of the respective semiconductor devices illustrated in FIGS. 1 to 22. As described above, it should be noted that the present invention includes various embodiments which are not disclosed herein. Therefore, the scope of the present invention is defined only by "the technical features specifying the invention" prescribed by the claims reasonably derived from the description heretofore.

What is claimed is:

1. A semiconductor device, comprising:
an insulated circuit board on which a semiconductor chip is mounted; and
a housing implemented by a plurality of side-walls including at least a first pair of facing side-walls, each of the facing side-walls having joint edges configured to be jointed with the insulated circuit board, and each of the joint edges has an arc-shape such that a center in an extending direction of the joint edge protrudes toward the insulated circuit board more than both ends of the extending direction of the joint edge,
wherein
the insulated circuit board is jointed to the housing such that a periphery of the insulated circuit board is pressed by the joint edges each having the arc-shape and the insulated circuit board is forced by the joint edges to be curved so as to have a predetermined amount of warpage,
the insulated circuit board includes an insulating substrate and a cooler-side conductive-foil provided on a cooler-side main-surface of the insulating substrate opposite to the semiconductor chip, and
the cooler-side conductive-foil extends to ends of the insulating substrate so as to overlap the joint edges.

2. The semiconductor device according to claim 1, wherein the predetermined amount of warpage amount of the insulated circuit board achieved by the arc-shapes of the joint edges is greater than zero micrometer and equal to or less than 100 micrometers.

3. The semiconductor device according to claim 2, wherein the housing has a rectangular-parallelepiped topology, and the joint edges are provided on shorter side-walls of the housing.

4. The semiconductor device according to claim 3, further comprising a pair of attachment-members configured to be attached to a cooler, the attachment-members being provided on longer side-walls of the housing, respectively.

5. The semiconductor device according to claim 4, wherein the predetermined amount of warpage of the insulated circuit board achieved by the arc-shapes implements a proximity area, which is defined as an area proximate to the cooler in a gap between the insulated circuit board and the cooler, and the cooler has a plurality of heat-radiation plates which extend in a direction orthogonal to an extending direction of the proximity area.

6. The semiconductor device according to claim 1, wherein each of the side-walls further includes a supporting outer-wall that supports the insulated circuit board.

7. The semiconductor device according to claim 6, further comprising a pocket configured to contain an adhesive between the side-walls and the insulated circuit board.

8. The semiconductor device according to claim 6, further comprising another pocket disposed between each side-wall and a corresponding outer-wall to contain the adhesive between the each side-wall and the corresponding outer-wall, the another pocket including an upper inner surface facing a side of the insulating circuit board on which the semiconductor chip is mounted.

9. The semiconductor device according to claim 1, wherein the housing has a plurality of pairs of the side-walls, each of the pairs of the side-walls has joint edges, each of joint edges having an arc-shape.

10. The semiconductor device according to claim 1, further comprising a pair of attachment-members provided on side-walls of the housing perpendicular to the side-walls having the joint edges.

11. The semiconductor device according to claim 1, further comprising a pair of attachment-members provided on the side-walls having the joint edges.

12. The semiconductor device according to claim 6, wherein
each side-wall includes an inner-wall having an inner side face which faces toward the other side-wall, and a joint portion having a bottom face corresponding to the joint edge, and
in a region between the inner side face and the joint portion, the inner-wall has an inclined face formed such that a thickness of the inner-wall decreases from the inner side face to the joint portion, in a direction toward the insulated circuit board.

13. The semiconductor device according to claim 12, wherein
the insulating substrate and the cooler-side conductive-foil each extend beyond the joint portion in a direction toward the supporting outer-wall.

14. The semiconductor device according to claim 13, wherein
the insulating substrate contacts an inner side surface of the supporting outer-wall.

15. The semiconductor device according to claim 1,
wherein the plurality of side-wall includes outer-walls, and the joint edge includes a joint portion facing toward the insulated circuit board, and
the semiconductor device further comprises:
- a first pocket, disposed between the insulated circuit board and a facing side-wall among the facing side-walls, having a triangular cross-section formed on one side of the joint portion between an inclined face of the facing side-wall and the insulating substrate and having an adhesive provided between the inclined face and the insulating substrate, the inclined face extending from the joint portion in a direction away from the insulated circuit board, and
- a second pocket, disposed between the insulated circuit board and an outer-wall among the outer-walls, having a rectangular cross-section formed on another side of the joint portion between an outer side face of the facing side-wall and an inner side face of the outer-wall, and having the adhesive provided between the inner side face of the outer-wall and the outer side face of the facing side-wall.

16. The semiconductor device according to claim 15, wherein
the insulating substrate and the cooler-side conductive-foil each extend beyond the joint portion in a direction toward the outer-wall and are disposed directly below the second pocket.

17. A method for manufacturing a semiconductor device, comprising:
mounting a semiconductor chip on an insulated circuit board;
preparing a housing implemented by a plurality of side-walls including at least a first pair of facing side-walls, each of the facing side-walls having joint edges configured to be jointed with the insulated circuit board, and each of the joint edges has an arc-shape such that a center in an extending direction of the joint edge protrudes toward the insulated circuit board more than both ends of the extending direction of the joint edge; and
jointing the insulated circuit board to the housing by attaching the housing to the insulated circuit board such that a periphery of the insulated circuit board is pressed by the joint edges each having the arc-shape, forcing the insulated circuit board to be curved so as to have a predetermined amount of warpage, the insulated circuit board including an insulating substrate and a cooler-side conductive-foil provided on a cooler-side main-surface of the insulating substrate opposite to the semiconductor chip, and the cooler-side conductive-foil extending to ends of the insulating substrate so as to overlap the joint edges.

18. The method according to claim 17, wherein the predetermined amount of warpage amount of the insulated circuit board achieved by the arc-shapes of the joint edges is greater than zero micrometer and equal to or less than 100 micrometers.

19. The method according to claim 17, wherein the housing has a rectangular-parallelepiped topology, and the joint edges are provided on shorter side-walls of the housing.

20. The method according to claim 19, further comprising providing a first attachment plate and a second attachment plate, for fastening the semiconductor device to a cooler, wherein
the first attachment plate is disposed at a central portion of a first side-wall of the housing, and the second attachment plate is disposed at a central portion of a second side-wall of the housing, and
the first and second side-walls correspond to longer side-walls of the housing.

* * * * *